(12) United States Patent
Margeson et al.

(10) Patent No.: US 10,371,920 B2
(45) Date of Patent: Aug. 6, 2019

(54) MIRROR ASSEMBLY WITH HEAT TRANSFER MECHANISM

(71) Applicant: NIKON CORPORATION, Tokyo (JP)

(72) Inventors: Christopher Margeson, Mountain View, CA (US); Travis Bow, East Palo Alto, CA (US)

(73) Assignee: NIKON RESEARCH CORPORATION OF AMERICA, Belmont, CA (US)

( * ) Notice: Subject to any disclaimer, the term of this patent is extended or adjusted under 35 U.S.C. 154(b) by 0 days.

(21) Appl. No.: 14/387,130

(22) PCT Filed: Mar. 7, 2013

(86) PCT No.: PCT/US2013/029640
§ 371 (c)(1),
(2) Date: Sep. 22, 2014

(87) PCT Pub. No.: WO2013/142083
PCT Pub. Date: Sep. 26, 2013

(65) Prior Publication Data
US 2015/0042970 A1    Feb. 12, 2015

Related U.S. Application Data

(60) Provisional application No. 61/614,357, filed on Mar. 22, 2012.

(51) Int. Cl.
*G02B 7/02*    (2006.01)
*G02B 7/18*    (2006.01)
(Continued)

(52) U.S. Cl.
CPC ............. *G02B 7/028* (2013.01); *G02B 7/181* (2013.01); *G02B 7/182* (2013.01); *G02B 7/1815* (2013.01);
(Continued)

(58) Field of Classification Search
CPC ...... G02B 7/181; G02B 7/182; G02B 7/1815; G02B 7/028
(Continued)

(56) References Cited

U.S. PATENT DOCUMENTS 4,694,375 A    9/1987  Devins et al.
5,535,047 A    7/1996  Hornbeck
(Continued)

FOREIGN PATENT DOCUMENTS

EP        1865359 A1    12/2007
JP     2012504323 A     2/2012
(Continued)

OTHER PUBLICATIONS

Milanovic, et al. "Highly adaptable MEMS-based display with wide projection angle", Micro Electro Mechanical Systems, IEEE 20th International Conference on MEMS, pp. 143-146, Jan. 21-25, 2007.
(Continued)

*Primary Examiner* — Evan P Dzierzynski
*Assistant Examiner* — Mitchell T Oestreich
(74) *Attorney, Agent, or Firm* — Roeder & Broder LLP; Steven G. Roeder

(57) ABSTRACT

A mirror assembly (32) for directing a beam (28) includes a base (450), and an optical element (454) that includes (i) a mirror (460), (ii) a stage (462) that retains the mirror (460), (iii) a mover assembly (464) that moves the stage (462) and the mirror (460) relative to the base (450), and (v) a thermally conductive medium (466) that is positioned between the stage (462) and the base (450) to transfer heat between the stage (462) and the base (450). The thermally conductive medium (466) has a thermal conductivity that is greater than the thermal conductivity of air. The thermally conductive medium (466) can include an ionic fluid or a liquid metal.

21 Claims, 17 Drawing Sheets

(51) Int. Cl.
*G02B 7/182* (2006.01)
*G03F 7/20* (2006.01)

(52) U.S. Cl.
CPC ...... *G03F 7/70075* (2013.01); *G03F 7/70116* (2013.01); *G03F 7/70316* (2013.01); *G03F 7/70891* (2013.01)

(58) Field of Classification Search
USPC .......................................................... 359/872
See application file for complete search history.

(56) References Cited

U.S. PATENT DOCUMENTS

| | | | |
|---|---|---|---|
| 5,661,591 | A | 8/1997 | Lin et al. |
| 5,727,685 | A | 3/1998 | Laganza et al. |
| 6,295,154 | B1 | 9/2001 | Laor et al. |
| 7,295,726 | B1 | 11/2007 | Milanovic et al. |
| 7,428,353 | B1 | 9/2008 | Milanovic et al. |
| 8,043,513 | B2 | 10/2011 | Milanovic et al. |
| 2005/0030653 | A1* | 2/2005 | Holderer ............... G02B 5/09 359/872 |
| 2005/0088634 | A1* | 4/2005 | Kosugi ............... G03F 7/70716 355/30 |
| 2006/0103908 | A1 | 5/2006 | Loopstra et al. |
| 2007/0115450 | A1 | 5/2007 | Nagasaka et al. |
| 2010/0020423 | A1 | 1/2010 | Phillips |
| 2010/0270709 | A1 | 10/2010 | Mertens et al. |
| 2011/0096306 | A1 | 4/2011 | Yoshimoto |
| 2011/0181852 | A1* | 7/2011 | Bleidistel ............. G02B 7/1827 355/30 |
| 2011/0211178 | A1 | 9/2011 | Sogard et al. |

FOREIGN PATENT DOCUMENTS

| | | |
|---|---|---|
| WO | WO2002010836 A | 2/2002 |
| WO | WO2010037476 A2 | 4/2010 |
| WO | WO2010037476 A3 | 4/2010 |
| WO | WO2013142083 A2 | 9/2013 |

OTHER PUBLICATIONS

The International Search Report and Written Opinion of the International Searching Authority, dated Aug. 27, 2014, Nikon Corporation, PCT/US13/29640. (related application).

Miner, et al., "High Temperature Operation of Gimbal-less Two Axis Micromirrors", Adriatic Research Institute, IEEE International Conference on Microelectromechanical Systems, 2007.

Jia, et al. "An Agile Tip-Tilt-Piston Micromirror with Large Aperture, Large Scanning Range, and Low Driving Voltage", @2008 TRF, Solid-State Sensors, Actuators, and Microsystems Workshop, 2008.

Sun, et al., "Mechanical design and system-lever analysis of a novel micromirror array", @2009 SPIE, Proc. of SPIE vol. 7510, pp. 751003-1 through 751003-12, 2009.

Milanovic et al., "Fully Functional Tip-Tilt-Piston Micromirror Array", Adriatic Research Institute. IEEE/LEOS Optical Microelectromechanical Systems and Their Applications Conference, 2006.

McManamon, et al., "A Review of Phased Array Steering for Narrow-Band Electrooptical Systems", Proceedings of the IEEE, vol. 97, No. 6, pp. 1078-1096, 2009.

Milanovic, et al. "Tip-Tilt-Piston Actuators for High Fill-Factor Micromirror Arrays", Adriatic Research Institute, Solid-State Sensor, Actuator, and Microsystems Workshop, pp. 232-237, 2004.

Milanovic, et al. "Gimbal-Less Monolithic Silicon Actuators for Tip-Tilt-Piston Micromirror Applications", IEEE Journal of Selected Topics in Quantum Electronics,vol. 10., No. 3, pp. 462-471, 2004.

The International Preliminary Report on Patentability, dated Sep. 23, 2014, Nikon Corporation, PCT/US13/29640. (related application).

* cited by examiner

MIRROR ASSEMBLY WITH HEAT TRANSFER MECHANISM

RELATED APPLICATION

This application claims priority on Provisional Application Ser. No. 61/614,357 filed on Mar. 22, 2012, entitled "MIRROR ASSEMBLY WITH HEAT TRANSFER MECHANISM". As far as is permitted, the contents of U.S. Provisional Application Ser. No. 61/614,357 are incorporated herein by reference.

BACKGROUND

Lithography systems are commonly used to transfer images from a reticle onto a semiconductor wafer during semiconductor processing. A typical lithography system includes an illumination system, a reticle stage assembly that positions a reticle, an optical assembly and a wafer stage assembly that positions a semiconductor wafer. The illumination system includes an illumination source that generates an illumination beam, and an illumination optical assembly that directs the illumination beam at the reticle.

The size of the features within the images transferred from the reticle onto the wafer is extremely small. In order to increase the resolution of the features and decrease the size of the features within the images, there is a need to use an illumination source that generates smaller or shorter wavelengths of light. For example, extreme ultraviolet (EUV) radiation, including wavelengths in the 11 to 13 nm range, is being evaluated for use in lithography systems. For extreme ultraviolet lithography systems, the optical assembly typically includes one or more reflective, optical elements, e.g. mirrors.

With EUV lithography systems, an EUV source generates the EUV beam, while an illumination optical assembly directs the EUV beam at the reticle. A typical illumination optical assembly includes one or more optical element assemblies that reflect and direct the EUV beam at the reticle. Unfortunately, existing coatings for the optical element assembly only reflect a portion of the EUV beam. As a result thereof, the optical element assembly absorbs a portion of the EUV beam. This heats the optical element assembly and can deform the optical element assembly. Further, the deformation of the optical element assembly can adversely influence the EUV beam reflected off of the optical element assembly.

SUMMARY

The present invention is directed to an optical element assembly for directing a beam. The optical element assembly can include a base, and a first optical mechanism that includes (i) an optical element, (ii) a stage that retains the optical element, (iii) a mover assembly that moves the stage and the optical element relative to the base, and (v) a thermally conductive medium that is positioned between the stage and the base to transfer heat between the stage and the base. In certain embodiments, the base includes one or more fluid passageways. In these embodiments, a circulation fluid can be directed through the base to control the temperature of the base.

In certain embodiments, the thermally conductive medium has a thermal conductivity that is greater than the thermal conductivity of air. For example, the thermally conductive medium can include an ionic fluid or a liquid metal. Alternatively, the thermally conductive medium can have a thermal conductivity that is less than or equal to the thermal conductivity of air.

In certain embodiments, the optical element is a mirror. As provided herein, materials are currently not available which provide very high reflectivities for the optical element assemblies at the short wavelengths of the illumination beam. As a result thereof, significant amounts of optical power are absorbed in the surfaces of the optical element. With the present design, the thermally conductive medium transfers the heat from the optical element via the stage to the base. This inhibits the optical elements from distorting thermally or damaging the reflective coating due to high temperatures.

The present invention is also directed to an exposure assembly for transferring an image from a reticle to a wafer. For example, the exposure assembly can include a reticle stage that retains and positions the reticle, a wafer stage that retains and positions the wafer, an illumination source that generates a beam, and the optical element assembly described above that conditions and directs the beam from the illumination source to the reticle.

The present invention is also directed to a process for manufacturing a device that includes the steps of providing a substrate and forming an image on the substrate with the exposure apparatus described above. Further, the present invention is directed to a method for directing a beam from an illumination source to a reticle.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
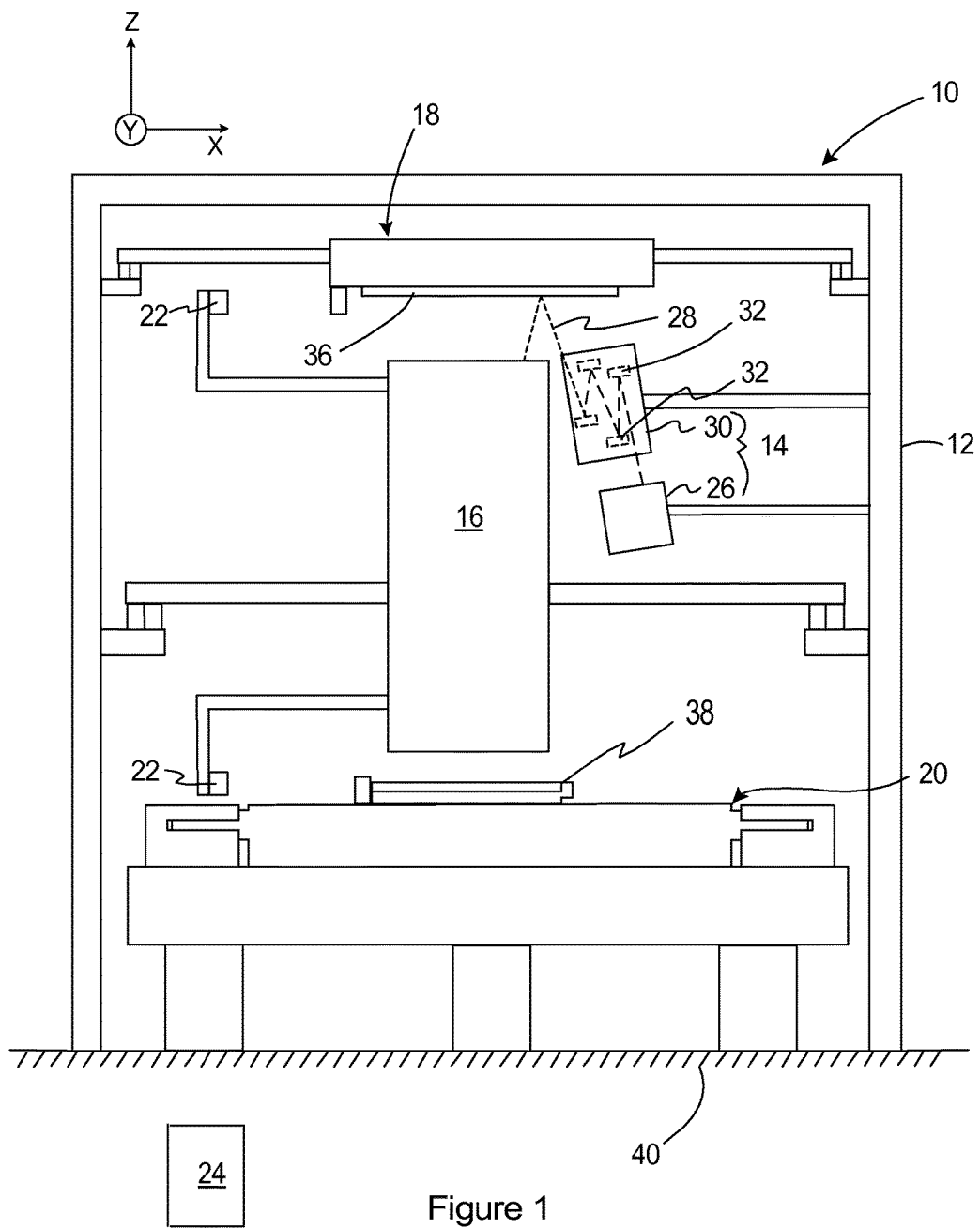
FIG. 1 is directed to a schematic view of a lithography system having features of the present invention.

FIG. 1 is a schematic illustration of a precision assembly, namely an exposure apparatus 10 (also referred to as a lithography apparatus) having features of the present invention. The exposure apparatus 10 includes an apparatus frame 12, an illumination system 14 (irradiation apparatus), an output optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As an overview, in certain embodiments, the illumination system 14 includes an illumination source 26 that generates a short wavelength illumination beam 28 (illustrated with dashed lines), and an illumination optical assembly 30 that includes one or more optical element assemblies 32 (two are illustrated in phantom) that are used to condition the illumination beam 28. As provided herein, materials are currently not available which provide very high reflectivities for the optical element assemblies 32 at the short wavelength of the illumination beam 28. In these situations, significant amounts of optical power are absorbed in the surfaces of the optical element assemblies 32. As provided herein, the optical element assemblies 32 are uniquely designed to minimize the amount of distortion caused by the power absorbed by the optical element assemblies 32.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 36 onto a semiconductor wafer 38. Alternatively, the lithographic device can transfer the pattern without the reticle 36. The exposure apparatus 10 mounts to a mounting base 40, e.g., the ground, a base, or floor or some other supporting structure.

There are a number of different types of lithographic devices. For example, the exposure apparatus 10 can be used as a scanning type photolithography system that exposes the pattern from the reticle 36 onto the wafer 38 with the reticle 36 and the wafer 38 moving synchronously. Alternatively, the exposure apparatus 10 can be a step-and-repeat type photolithography system that exposes the reticle 36 while the reticle 36 and the wafer 38 are stationary. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The reticle 36 can be a reflective type as illustrated in FIG. 1. The pattern in the reticle 36 that is to be transferred to the wafer 38 is defined by the local regions of the reticle 36 where the reflectivity at the illumination radiation wavelengths of the reticle surface has been reduced to a very small value, thereby providing maximum image contrast at the wafer 38.

The wafer 38 includes a substrate that is covered with a photoresist. The photoresist can be photosensitive to some wavelengths of radiation and not sensitive to other wavelengths of radiation. For example, the photoresist can be sensitive to extreme electromagnetic ultraviolet radiation including wavelengths in the 10 to 15 nm range.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 40.

The illumination source 26 emits the illumination beam 28 (irradiation) of light energy. The illumination optical assembly 30 guides the beam of light energy 28 from the illumination source 26 to the reticle 36. The beam 28 illuminates selectively different portions of the reticle 36 and exposes the wafer 38. In FIG. 1, the illumination source 26 is illustrated as being supported by the apparatus frame 12.

Radiation reflected from the reticle 36 is directed by the optical assembly 16 on the semiconductor wafer 38 to expose the photosensitive resist.

In one embodiment, the illumination source 26 generates an extreme ultraviolet (EUV) illumination beam 28, including illumination wavelengths of between approximately 10-15 nm and typically illumination wavelengths in the 11 to 13 nm range, also referred to as the soft X-ray region. In this design, the illumination source 26 can be a synchrotron radiation source or laser plasma source. Alternatively, for example, the illumination source 26 can be a gas discharge source. Still alternatively, the illumination beam 28 can be a different wavelength than the examples provided herein.

The illumination optical assembly 30 is described in more detail below.

The output optical assembly 16 collects and focuses the illumination beam 28 that is reflected from the reticle 36 to the wafer 38. For an EUV illumination source 26, the optical assembly 16 is an all reflective system that includes one or more mirrors (not shown) that collect and focus the illumination beam 28. The number of mirrors and the arrangement of the mirrors can be varied to suit the requirements of the optical assembly 16.

The reticle stage assembly 18 holds and positions the reticle 36 relative to the output optical assembly 16 and the wafer 38. Somewhat similarly, the wafer stage assembly 20 holds and positions the wafer 38 with respect to the projected image of the illuminated portions of the reticle 36.

In one embodiment, one or more linear motors can be used in the reticle stage assembly 18 and/or the wafer stage assembly 20. When linear motors (see U.S. Pat. No. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

The measurement system 22 monitors movement of the reticle 36 and the wafer 38 relative to the optical assembly 16 or some other reference. With this information, the control system 24 can control the reticle stage assembly 18 to precisely position the reticle 36 and the wafer stage assembly 20 to precisely position the wafer 38. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage mover assemblies 18, 20 to precisely position the reticle 36 and the wafer 38. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

It should be noted that for an EUV system, the illumination beam 28 should travel in a vacuum. For example, the illumination source 26, the illumination optical assembly 30, the reticle stage assembly 18, the output optical assembly 16, and the wafer stage assembly 20 can be positioned within a vacuum chamber (not shown). Alternatively, the present invention can be used in a non-vacuum environment.

Figure 2:
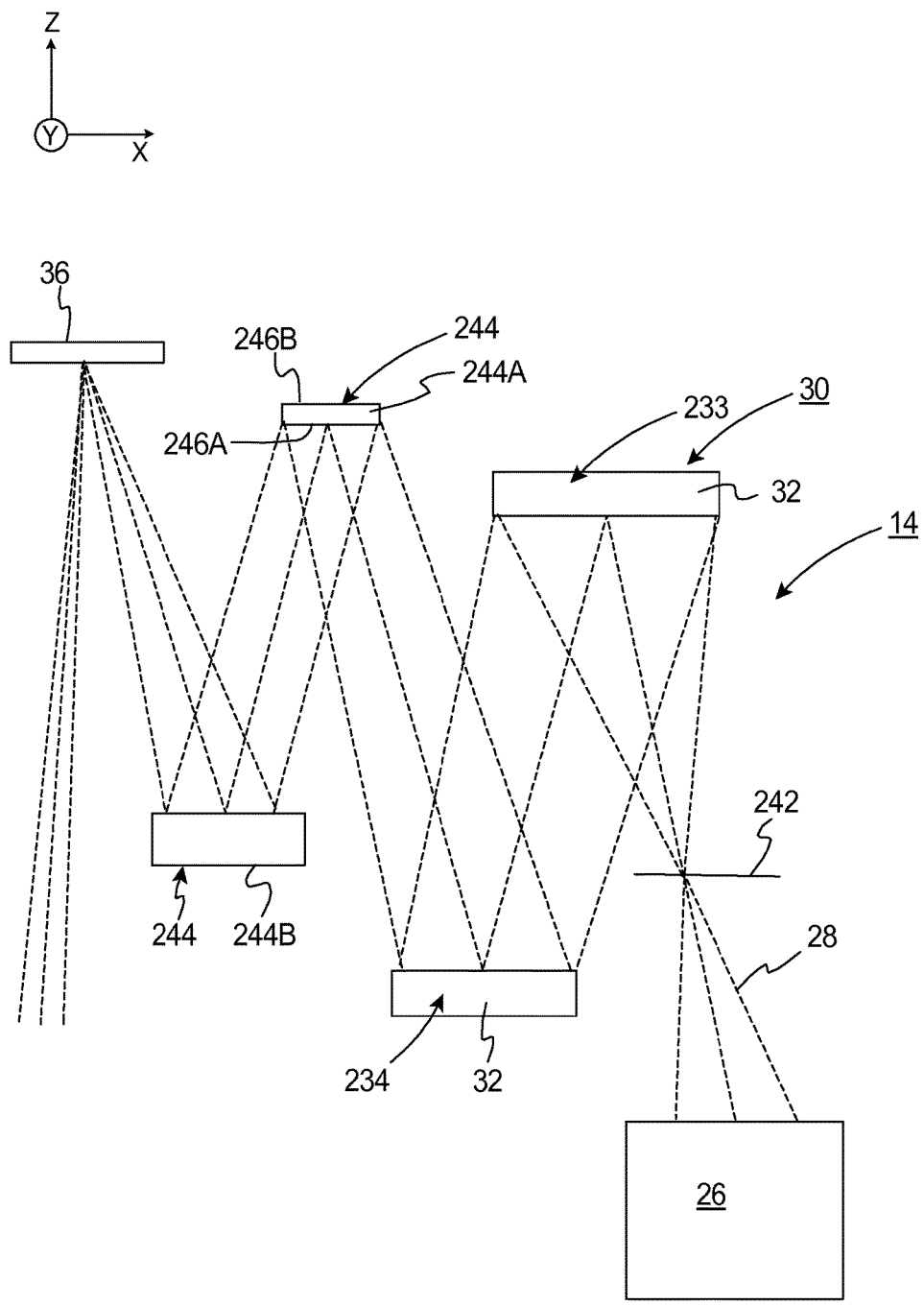
FIG. 2 is a simplified illustration of an illumination system having features of the present invention and a reticle.

FIG. 2 is a simplified illustration of one, non-exclusive embodiment of the illumination system 14 and the reticle 36. In this embodiment, the illumination system 14 includes the illumination source 26 that generates the illumination beam 28, and the illumination optical assembly 30 that directs the illumination beam 28 at the reticle 36. Further, in this embodiment, the illumination optical assembly 30 includes a focus plate 242, one or more condenser elements 244 (illustrated as boxes), and one or more optical element assemblies 32 (illustrated as boxes). The design and positioning of each of these components can be varied pursuant to the teachings provided herein. Further, the illumination system 14 can include greater or fewer components than illustrated in FIG. 2.

The focus plate 242 creates an intermediate focus point for the illumination beam 28. In one non-exclusive embodiment, the focus plate 242 is a generally flat plate that includes an aperture so that the illumination beam 28 can pass through.

In this embodiment, the condenser elements 244 direct and focus the illumination beam 28 reflected off of the optical element assemblies 32 onto the reticle 36. In FIG. 2, the illumination optical assembly 30 includes two condenser elements 244, namely a first condenser element 244A and a second condenser element 244B. Alternatively, the illumination optical assembly 30 can include more than two condenser elements 244.

In one embodiment, each of the condenser elements 244 is an optical element that includes a front surface 246A and an opposed rear surface 246B. The front surface 246A defines a figure that is curved so that the light rays that strike the front surface 246A converge or diverge. The front surface 246A is coated with multiple thin layers of material that collectively create a fairly reflective surface at the wavelength of the illumination beam 28. The type of material utilized for the layers of reflective material will depend upon the wavelength of the radiation generated by the illumination source 26. For example, suitable layers include molybdenum/silicon for wavelengths of approximately 13 nm and molybdenum/beryllium for wavelengths of approximately 11 nm. However, other materials may be utilized.

At the short wavelengths of EUV radiation, materials are currently not available for the reflective thin layers which will provide very high reflectivities typical of optical reflective coatings at visible and near visible wavelengths. Achievable reflectivities may not exceed much more than r=0.65, as compared to greater than 0.99 at longer wavelengths. As a result, significant amounts of optical power are absorbed in the surfaces of the optical elements. In one embodiment, each condenser element 244 can include one or more circulating recess (not shown) that extend through the condenser elements 244 for cooling the condenser elements 244. The circulating recess can be positioned in the condenser elements 244 so that a circulating fluid can be circulated relatively evenly throughout the condenser elements 244.

In FIG. 2, the illumination optical assembly 30 includes a first optical element assembly 233 (illustrated as a box) and a second optical element assembly 234 (illustrated in box) that adjust and change the illumination conditions of the illumination beam 28. In FIG. 2, the illumination beam 28 is directed from the illumination source 26, through the focus plate 242 and at the first optical element assembly 233. Further, light reflected off of the first optical element assembly 233 is directed at the second optical element assembly 234. Subsequently, light reflected off of the second optical element assembly 234 is directed at the first condenser element 244A. Next, light reflected off of the first condenser element 244A is directed at the second condenser element 244B. Finally, light reflected off of the second condenser element 244B is directed at the reticle 36.

As provided herein, the first optical element assembly 233 can be referred to as a first fly-eye optical system, and the second optical element assembly 234 can be referred to as a second fly-eye optical system.

Figure 3:
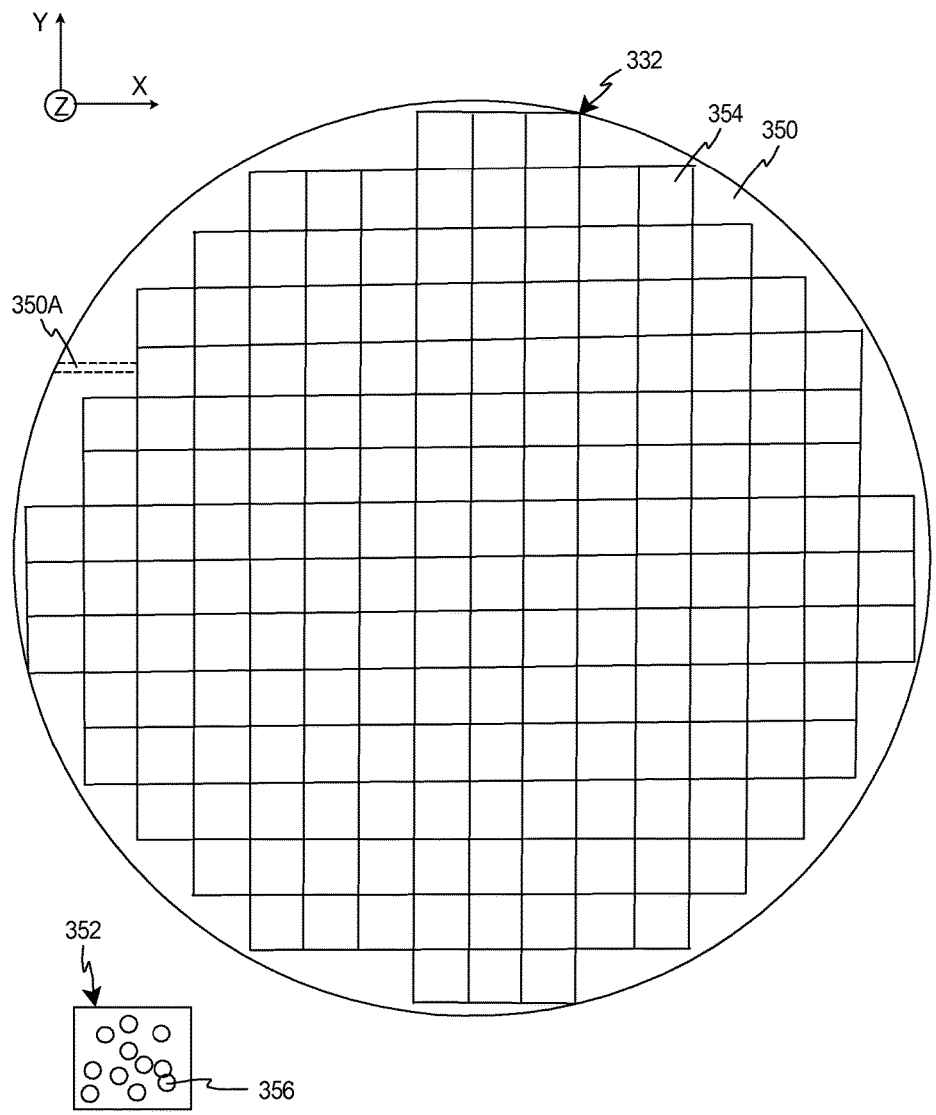
FIG. 3 is a simplified top view of an optical element assembly having features of the present invention.

FIG. 3 is a simplified, top view of a non-exclusive embodiment of an optical element assembly 332 having features of the present invention. For example, the optical element assembly 332 can be used as the first optical element assembly 233 (illustrated in FIG. 2) or the second optical element assembly 234 (illustrated in FIG. 2) of the illumination optical assembly 30 (illustrated in FIG. 2). Alternatively, the optical element assembly 332 can be used in another type of optical assembly (not shown).

In one embodiment, the optical element assembly 332 includes a base 350, a circulation system 352 (illustrated as a box), and a plurality of optical elements 354 that cooperate to reflect and shape the beam 28 (Illustrated in FIG. 2). The size, shape, and orientation of these components can be varied pursuant to the teachings provided herein.

In FIG. 3, the base 350 is rigid to support the optical elements 354. The base 350 can include a plurality of fluid passageways 350A (a small portion is illustrated in phantom) so that the circulation system 352 can direct a circulation fluid 356 (illustrated as circles) through the fluid passageways 350A of the base 350 to actively control the temperature of the base 350 and the optical elements 354, and remove heat from the base 350 and the optical elements 354. With this design, the base 350 functions like a heat exchanger in which heat from the optical elements 354 is transferred to the base 350 and the base 350 transfers heat to the circulation fluid 356. In one embodiment, the base 350 is made of material having a relatively high thermal conductivity.

Further, in FIG. 3, the base 350 is generally circular disk shaped. Alternatively, the base 350 can have another shape, e.g. rectangular shaped.

The number and design of the optical elements 354 can be varied to suit the design requirements of the optical element assembly 332. For example, each optical element 354 can include a mirror that is designed to reflect the light at the desired wavelength. Alternatively, for example, the optical element 354 includes one or more reflective surfaces, lenses or any other type of element.

In FIG. 3, the optical element assembly 332 includes approximately 183 individual optical elements 354 that are arranged in close proximity and adjacent to each other, and all of these individual optical elements 354 are approximately in the same plane. In the embodiment illustrated in FIG. 3, each individual optical element 354 is generally shaped like a rectangle, and the overall pattern of the arranged optical elements 354 is generally shaped like circle. Alternatively, the optical element assembly 332 can include more than or fewer than 183 optical elements 354, one or more of the optical elements 354 can have a shape different than rectangular (e.g. circular), and/or the optical elements 354 can be arranged in a different shape than circular (e.g. rectangular). As another example, the optical element assembly 332 can include approximately five thousand different optical elements 354.

It should be noted that any of these optical elements 354, can be referred to as a first optical element, a second optical element, a third optical element, fourth optical element, etc. for convenience.

The optical elements 354 are slightly spaced apart to allow for individual movement of the optical elements 354. This gap is not illustrated in simplified FIG. 3. As non-exclusive examples, a gap of approximately twenty, fifty, one hundred, or five hundred microns can separate adjacent optical elements 354. However, other gaps are possible.

As provided herein, one or more of the optical elements 354 is independently movable relative to the base 350 to adjust the characteristics of the beam 28. For example, each of the optical elements 354 can be independently adjustable.

Figure 4A:
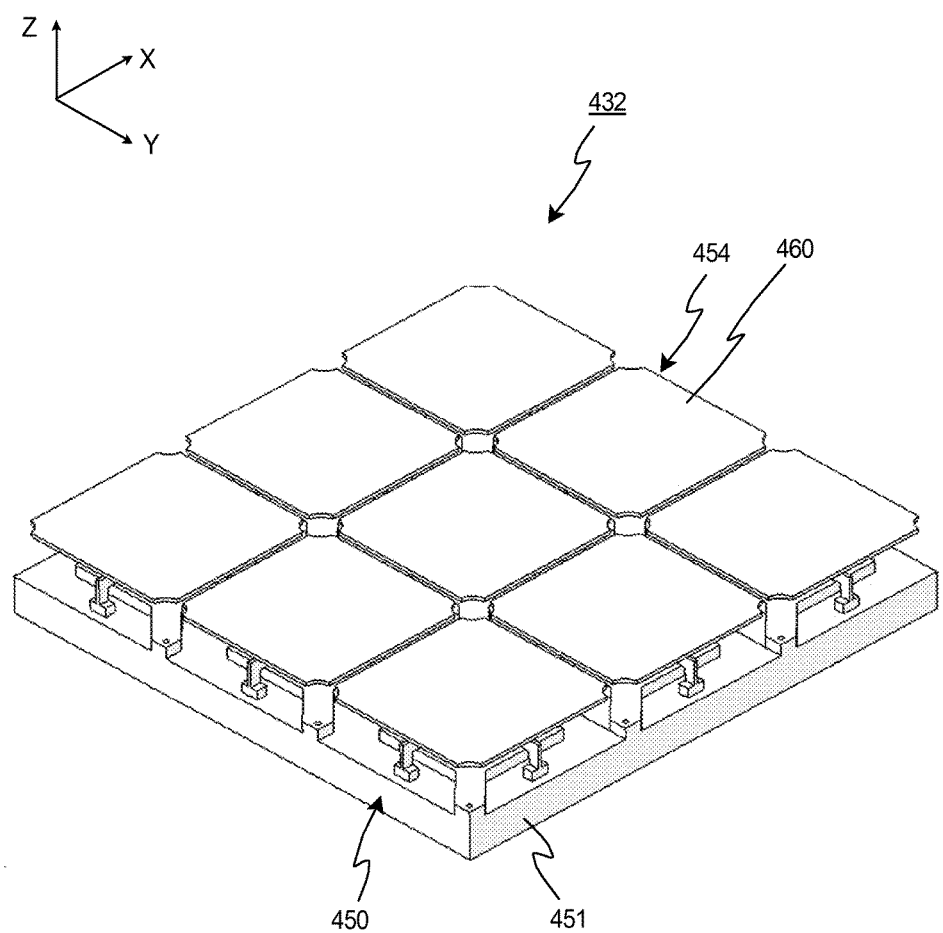
FIG. 4A is a perspective view of a portion of an optical element assembly having features of the present invention.
Figure 4B:
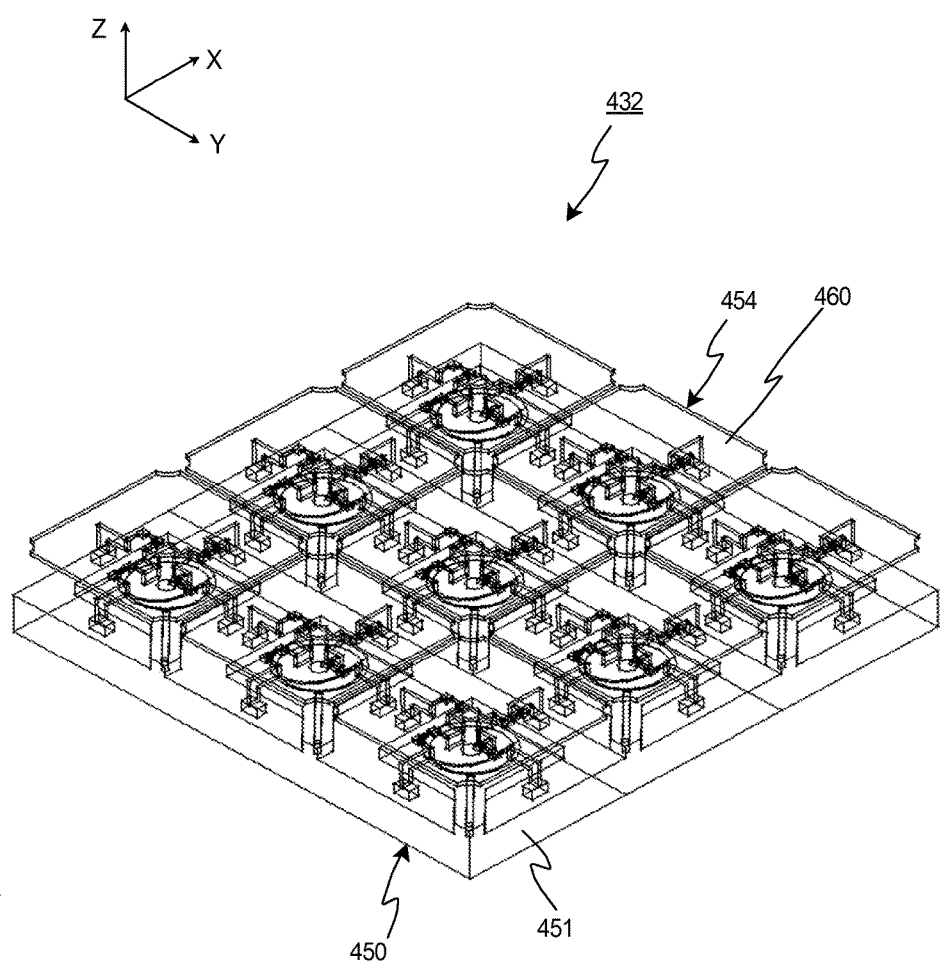
FIG. 4B is a perspective view of the optical element assembly of FIG. 4A with the components under a plurality of optical elements being visible.

FIG. 4A is a perspective view of a portion of an optical element assembly 432 having features of the present invention, and FIG. 4B is a perspective view of the optical element assembly 432 of FIG. 4A with the components under a plurality of optical elements 460 being visible. In this embodiment, the optical element assembly 432 includes nine individual optical elements 454, and the base 450 is generally rectangular. Further, in this embodiment, the base 450 includes a separate, rigid base unit 451 for each optical element 454.

In one embodiment, the base units 451 can be fixedly secured together to form the base 450, and the temperature of one or more of the base units 451 can be individually controlled with the circulation system 352 (illustrated in FIG. 3). For example, in one embodiment, the circulation system 352 can be designed to individually control the pressure and temperature of the circulation fluid 356 (illustrated in FIG. 3) to each of the base units 451. Alternatively, the circulation system 352 can be designed to individually control the pressure and temperature of the circulation fluid 356 (illustrated in FIG. 3) to one or more groups of base units 451. Still alternatively, the circulation system 352 can be designed to direct the circulation fluid 356 (illustrated in FIG. 3) to all of the base units 451 at the same pressure and temperature.

In yet another embodiment, the base 450 can be a monolithic structure or multiple optical elements 454 can be secured to a common, one piece base 450.

Figure 4C:
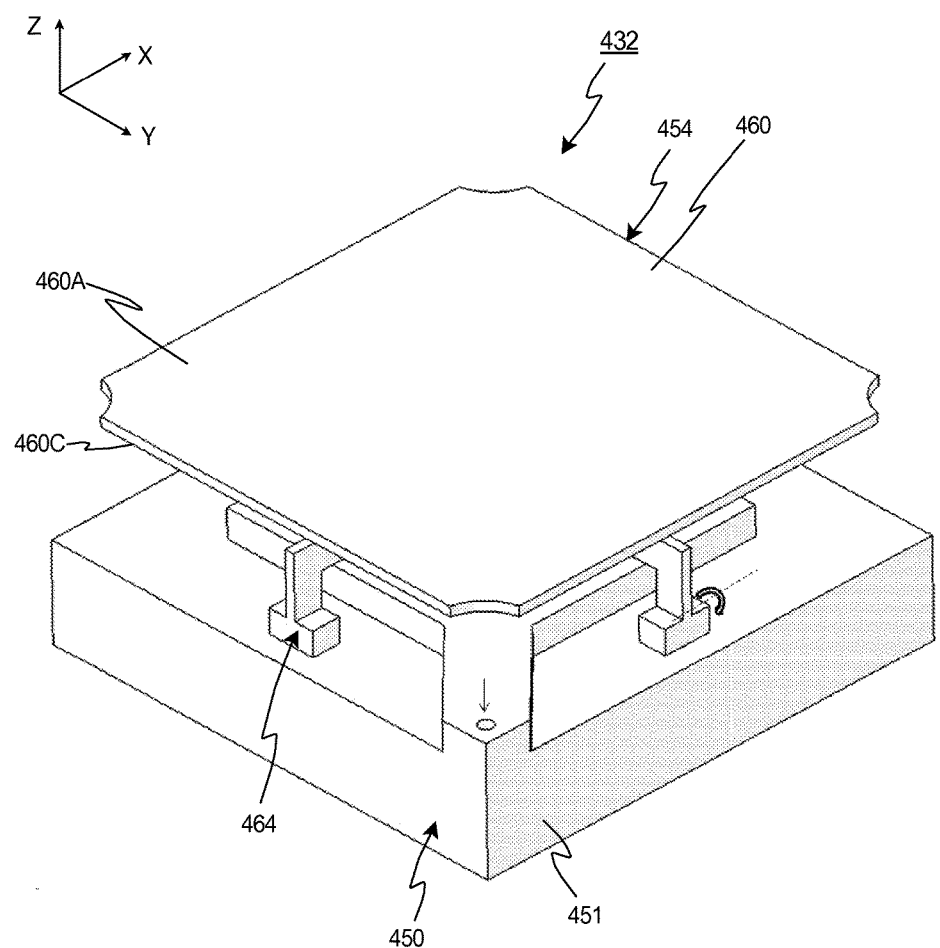
FIG. 4C is a perspective view of an optical element from the optical element assembly of FIG. 4B.
Figure 4D:
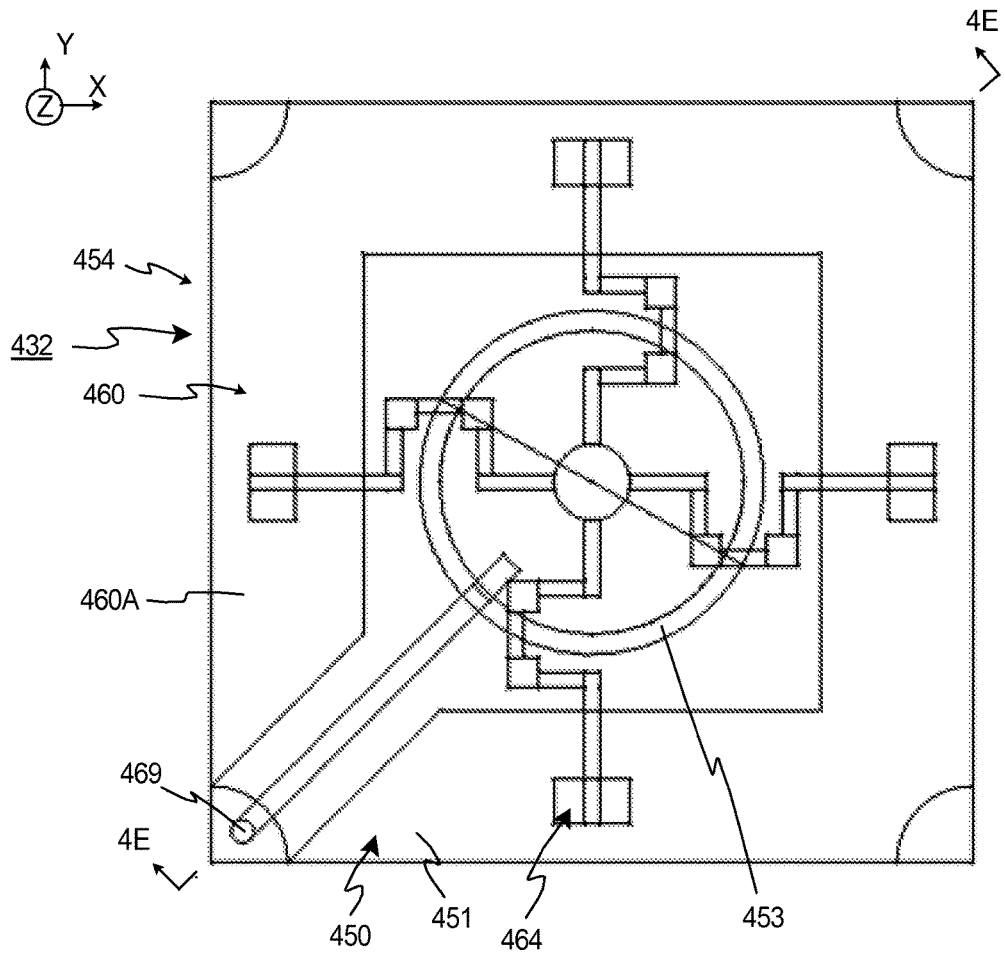
FIG. 4D is a top view of the optical element of FIG. 4C.
Figure 4E:
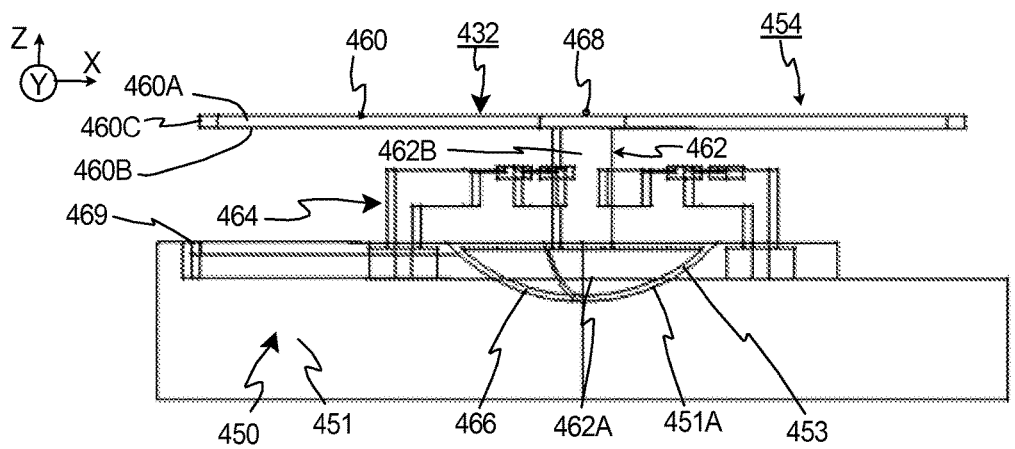
FIG. 4E is a cut-away view of the optical element taken on line 4E-4E of FIG. 4D.

FIG. 4C is a perspective view and FIG. 4D is a top view of one of the optical elements 454 and a base unit 451 of FIGS. 4A and 4B. Further, FIG. 4E is a cut-away view taken on line 4E-4E of FIG. 4D. It should be noted that optical element elements 454 can include mirrors, reflective surfaces, lenses or any other type of optical element.

In this embodiment, the element 454 includes (i) an optical element 460, (ii) a stage 462 that retains the optical element 460, (iii) a mover assembly 464 that moves the stage 462 and the optical element 460 relative to the base unit 451 of the base 450, and (v) a thermally conductive medium 466 that is positioned between the stage 462 and the base 450 to transfer heat between the stage 462 and the base 450. With this design, the base 450 can be used to efficiently remove the heat generated in the optical elements 460 due to the significant amount of optical power that is absorbed in the optical elements 460. This reduces the amount of distortion in the optical elements 460.

Alternatively, the optical element 460 can be replaced with another type of optical element or another type of element.

In one embodiment, the base unit 451 is generally rectangular shaped and includes an element recess 451A that receives the thermally conductive medium 466 and, in certain embodiments, the element recess 451 is sized to make room for a portion of the stage 462 (e.g. the bottom of the stage 462). In FIG. 4E, the element recess 451A is shaped to receive a portion of a sphere. Alternatively, the element recess 451A can have another configuration.

The optical element 460 defines a reflective surface 460A that reflects the beam 28. In this embodiment, the optical element 460 includes a generally rectangular shaped, rigid optical element body having (i) the planar, upper reflective surface 460A, (ii) a planar, lower mounting surface 460B that is opposite the upper reflective surface 460A, and (iii) four sides 460C. As a non-exclusive example, each optical element 460 can be approximately five millimeters by five millimeters. Alternatively, the surfaces 460A, 460B and/or the side 460C can have a configuration that is different than that illustrated in Figures. For example, the upper reflective surface 460A can be curved.

The reflective surface 460A is coated with multiple thin layers of material that collectively create a fairly reflective surface at the wavelength of the illumination beam 28 (illustrated in FIG. 2). The type of material utilized for the layers of reflective material will depend upon the wavelength of the illumination beam 28. For example, suitable layers include molybdenum/silicon for wavelengths of approximately 13 nm and molybdenum/beryllium for wavelengths of approximately 11 nm. However, other materials may be utilized. As provided above, at the short wavelengths, materials are currently not available for the reflective thin layers which will provide very high reflectivities typical of optical reflective coatings at visible and near visible wavelengths. Achievable reflectivities may not exceed much more than r=0.65, as compared to greater than 0.99 at longer wavelengths. As a result, significant amounts of optical power are absorbed in the surfaces of the optical elements.

As a non-exclusive example, the optical element body can be made from Silicon, Copper, Molybdenum or another suitable material.

The stage 462 retains the optical element 460. For example, the optical element 460 can be secured to the stage 462 with an adhesive. Alternatively, the optical element 460 and the stage 462 can be made of a continuous piece.

The design of the stage 462 can be varied pursuant to the teachings provided herein. In the non-exclusive embodiment illustrated in FIG. 4E, the stage 462 includes a transfer region 462A that is positioned adjacent to the thermally conductive medium 466 and the base 450, and a connector region 462B that connects the optical element 460 to the transfer region 462A. As provided, the stage 462 can be made of a continuous piece, or the transfer region 462A and the connector region 462B can be secured together with an adhesive or by another method.

The transfer region 462A is sized and shaped to facilitate the transfer of heat via the thermally conductive medium 466 to the base 450 while allowing for movement of the stage 462 relative to the base 450. In the embodiment illustrated in FIG. 4E, the transfer region 462A is shaped somewhat similar to a truncated sphere and is sized and shaped to fit within the element recess 451A with a thin space therebetween that is filled with the thermally conductive medium 466. This design facilitates the transfer of heat via the thermally conductive medium 466 to the base 450 while allowing for movement of the stage 462 relative to the base 450.

As provided herein, in certain embodiments, the heat transfer region 462A is positioned below the connector region 462B (where the mover assembly 464 is connected to the stage 462). Further, the transfer region 462A is relatively large and as large as possible. These features facilitate the transfer of heat from the optical element 460.

The connector region 462B rigidly connects the optical element 460 to the transfer region 462A and facilitates the transfer of heat from the optical element 460 to the transfer region 462A. In one non-exclusive embodiment, the connector region 462B is generally cylindrical rod shaped and includes a top that is connected to the mounting surface 460B of the optical element 460 and a bottom that is secured to the transfer region 462A. Alternatively, the connector region 462B can have a different configuration (e.g. a rectangular beam shape) than that illustrated in FIG. 4E.

The mover assembly 464 precisely moves the stage 462 and the optical element 460 relative to the base 450. In one embodiment, the mover assembly 464 is uniquely designed to move the stage 462 and the optical element 462 approximately about a movement point 468 (illustrated as a small circle in FIG. 4E). Further, in certain embodiments, the mover assembly 464 is uniquely designed so that the movement point 468 is located approximately at or near a center of the reflective surface 460A of the optical element 460. With this design, the mover assembly 464 can precisely adjust the position of each optical element 460 without interfering with any adjacent optical elements 460.

In certain embodiments, if the mover assembly 464 is designed to move the optical element 462 about the first axis (X axis) and about the second axis (Y axis), the optical element 462 pivots about the movement point 468 during movement about both of these axes.

The design of the mover assembly 464 can be varied pursuant to the teachings provided herein. In one embodiment, the mover assembly 464 moves the optical element 460 about a first axis (e.g. the X axis) and about a second axis (e.g. the Y axis) that is orthogonal to the first axis. One, non-exclusive embodiment of the mover assembly 464 is described in more detail in the discussion of FIG. 4I below.

The thermally conductive medium 466 is positioned between the stage 462 and the base 450 to transfer heat between the stage 462 and the base 450. As provided herein, the thermally conductive medium 466 has a thermal conductivity that is greater than or less than the thermal conductivity of air. In certain embodiments, the thermally conductive medium 466 has a relatively high thermal conductivity to facilitate the transfer of heat. As alternative, non-exclusive embodiments, the thermally conductive medium 466 has a thermal conductivity of at least approximately 0.1, 0.2, 1, 20, or 40 (W/(m*K)). In one embodiment, the thermally conductive medium 466 includes an ionic fluid. Alternatively, or additionally, the thermally conductive medium 466 can include a liquid metal.

In certain embodiments, the beam is an EUV beam that has a relatively short wavelength. As provided above, existing coatings only reflect a portion of the EUV beam. As a result thereof, the optical element 460 absorbs a portion of the EUV beam and the optical element 460 is heated by the absorbed EUV beam. This heats the optical element 460 and can deform the optical element 460. Further, the deformation of the optical element 460 can adversely influence the EUV beam reflected off of the optical element 460. With this design, the thermally conductive medium 466 can be used to efficiently remove the heat generated in the optical element 460 even in a vacuum environment. This reduces the amount of distortion in the optical elements 460.

Additionally, FIG. 4E illustrates a fluid inlet 469 in the base 450 for directing the thermally conductive medium 466 into the space between the base 450 and the transfer region 462A.

It should be noted with the design illustrated in FIGS. 4D and 4E, in certain embodiments, because the shape of the element recess 451A matches the partial spherical shape of the transfer region 462A, a gap 453 between the transfer region 462A and the base 450 can be relatively small. With this design, the thickness of the thermally conductive medium 466 can be maintained relatively small and substantially uniform during movement of the transfer region 462A relative to the base 450. This will facilitate the efficient transfer of heat to the base 450. As alternative, non-exclusive embodiments, the gap 453 (and thickness of the thermally conductive medium 466) can be less than approximately 10, 50, 100, 150, 500, or 1000 microns.

Figure 4F:
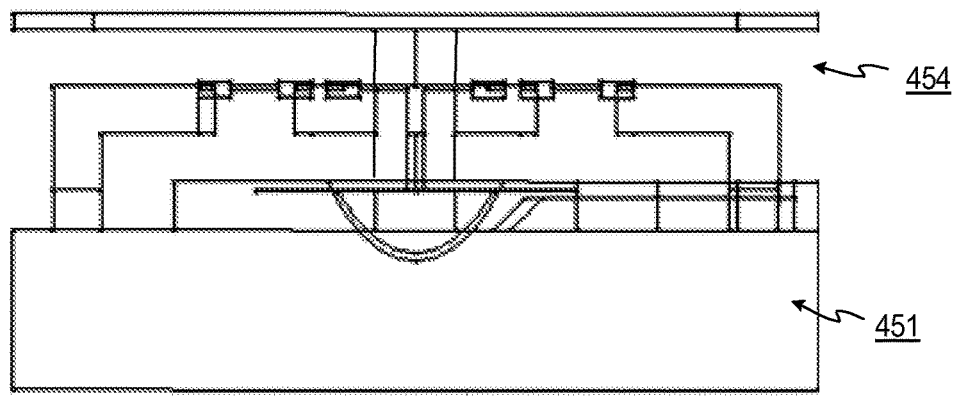
FIG. 4F is a left view of the optical element of FIG. 4C.
Figure 4G:
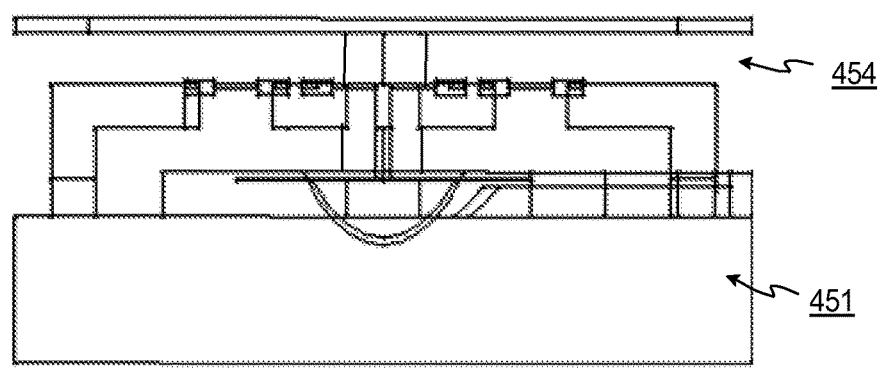
FIG. 4G is a front view of the optical element of FIG. 4C.
Figure 4H:
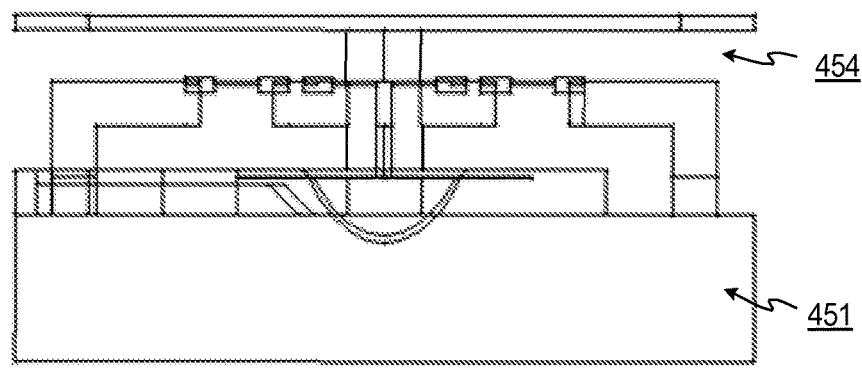
FIG. 4H is a right view of the optical element of FIG. 4C.

FIG. 4F is a left view, FIG. 4G is a front view, and FIG. 4H is a right view of the optical element 454 and the base unit 451 of FIG. 4C.

Figure 4I:
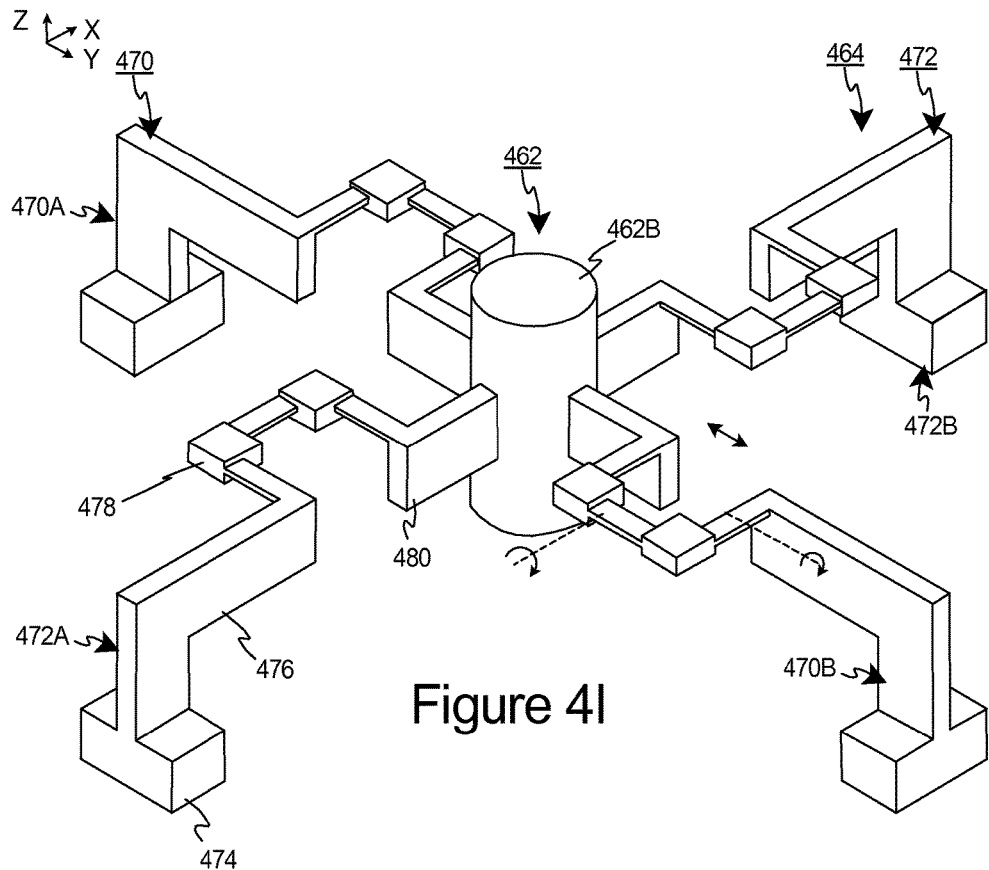
FIG. 4I is a perspective view of a portion of the optical element of FIG. 4C.

FIG. 4I is a perspective view of one, non-exclusive embodiment of the mover assembly 464 and the connector region 462B of the stage 462.

In this embodiment, the mover assembly 464 includes (i) a first axis movement assembly 470 that moves the stage 462 and the optical element 460 (not shown in FIG. 4I) about the first axis (X axis); and (ii) a second axis movement assembly 472 that moves the stage 462 and the optical element 460 about the second axis (Y axis). In one non-exclusive embodiment, the first axis movement assembly 470 can rotate the optical element 460 plus or minus three degrees about the first axis, and the second axis movement assembly 472 can rotate the optical element 460 plus or minus three degrees about the second axis. Alternatively, the mover assemblies 470, 472 can be designed to rotate the optical element more or less than three degrees.

In one embodiment, (i) the first axis movement assembly 470 includes a left mover sub-assembly 470A and a right mover sub-assembly 470B that can be controlled to rotate the optical element 460 back and forth about the first ("X") axis; and (ii) the second axis movement assembly 472 includes a left mover sub-assembly 472A and a right mover sub-assembly 472B that can be controlled to rotate the optical element 460 back and forth about the second ("Y") axis. Further, the mover sub-assemblies 470A, 470B, 472A, 472B are spaced apart at right angles relative to each other.

In this embodiment, each mover sub-assembly 470A, 470B, 472A, 472B includes (i) a mover 474, (ii) a mover beam 476, (iii) a flexure 478, and (iv) a connector beam 480. The design of each of these components can be varied pursuant to the teachings provided herein. It should be noted that the combination of (i) the mover beam 476, (ii) the flexure 478, and (iii) the connector beam 480 can be referred to as a linkage.

In one embodiment, each mover 474 is secured to the base 450 and is controlled to selectively move (e.g. rotate) its respective mover beam 476 relative to the base 450. As a non-exclusive embodiment, each mover 474 is a rotary mover. For example, each mover 474 can be a comb drive that produces a torque that causes rotation of respective mover beam 476.

The mover beam 476 is a substantially rigid beam. In FIG. 4I, each mover beam 476 is shaped generally like a sideways "L". With the present design, the movement point 468 (illustrated in FIG. 4E) is near the center of the top of the optical element 460. As a result thereof, in certain embodiments, the movers 474 can move the respective optical element 460 with "pure" rotation without unwanted lateral and vertical motion of the optical element 460.

For each mover sub-assembly 470A, 470B, 472A, 472B, the flexure 478 flexibly connects the mover beam 476 to the connector beam 480. In one embodiment, each flexure 478 allows for rotations about the first axis and about the second axis and some translation (along either the first or second axis). The two rotations and the translation are illustrated in FIG. 4I for one of the flexures 478. The flexures 478 allow for the decoupling of the undesirable forces. More specifically, the flexures 478 allow the tilt around one axis to be decoupled from the tilt around another axis. With this design, the first axis movement assembly 470 can rotate the stage 462 independently (or simultaneously) with the second axis movement assembly 472. If the first axis movement assembly 470 is rotating the stage 472 and the second axis movement assembly 472 is stationary, the flexures 478 of the first axis movement assembly 470 will be bending about the X axis and the flexures 478 of the second axis movement assembly 472 will be twisting about the X axis to take up the rotation. Alternatively, if the second axis movement assembly 472 is rotating the stage 472 and the first axis movement assembly 470 is stationary, the flexures 478 of the second axis movement assembly 472 will be bending about the Y axis and the flexures 478 of the first axis movement assembly 470 will be twisting about the Y axis to take up the rotation. Thus, both movement assemblies 470, 472 can be moved independently without fighting against each other.

It should be noted that a plurality of different type of flexures 478 can be utilized.

The connector beam 480 for each of the mover sub-assemblies 470A, 470B, 472A, 472B cantilevers radially away from the connector region 462B and is fixedly secured to the connector region 462B. Further, the connector beams 480 are equally spaced apart around the connector region 462B. With this design, the four connector beams 480 extend away radially at ninety degree intervals from the connector region 462B. Moreover, the connector beams 480 are substantially rigid. In FIG. 4I, the connector beams 480 are connected to the connector region 462B approximately intermediate the two ends of the connector region 462B.

Figure 4J:
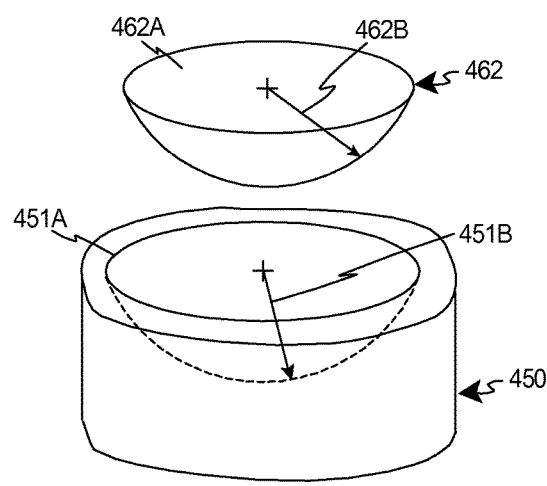
FIG. 4J is an exploded perspective view of another portion of the optical element of FIG. 4C.

FIG. 4J is an exploded perspective view of another portion of the optical element of FIG. 4C. More specifically, FIG. 4J illustrates the transfer region 462A of the stage 462 and the element recess 451A of the base 450. In this embodiment, the transfer region 462A is shaped similar to a truncated sphere (segment of a sphere) and has a region radius 462B. Further, the element recess 451A is an indentation in the base 450 that is shaped similar to a truncated sphere (segment of a sphere) and has a recess radius 451B. As provided herein, in certain embodiments, the element recess 451A is sized and shaped to correspond to and receive at least a portion of the transfer region 462A. Further, the element recess 451A is slightly larger than the transfer region 462A. With this design, the gap 453 (illustrated in FIG. 4E) between the transfer region 462A and the base 450 can be filled with the thermally conductive medium 466 (not shown in FIG. 4I).

The size of the gap 453 can be varied. If the curved surface of the transfer region 462A is fairly flat (with a large radius), then the element recess 451A will be a very small percentage larger (with a given gap). If the curved surface of the transfer region 462A is very curved (small radius), the same gap will be a much larger percentage. In certain, non-exclusive embodiments, the radius of curvature will be approximately 3-5 millimeters and the gap 453 will be approximately 100 μm or so, (e.g. 2-3%).

Figure 5:
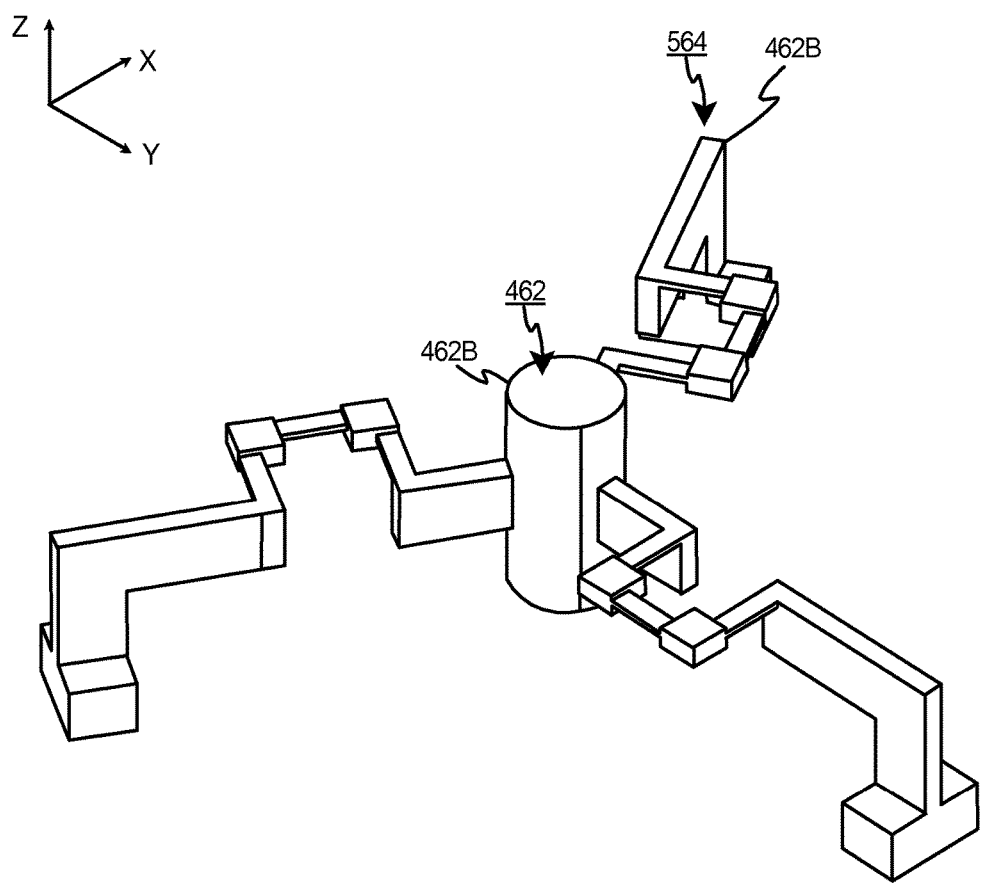
FIG. 5 is a perspective view of a portion of another embodiment of an optical element having features of the present invention.

FIG. 5 is a perspective view of the connector region 462B of the stage 462 and another embodiment of the mover assembly 564 that is somewhat similar to the mover assembly 464 described above and illustrated in FIG. 4I. However, in this embodiment, instead of four mover sub-assembly 470A, 470B, 472A, 472B (illustrated in FIG. 4I) placed at right angles, the mover assembly 564 includes three, equally spaced (at one-hundred and twenty degrees) mover sub-assemblies 570 that are individually controlled to move the stage 462 (not shown in FIG. 5) and the optical element 460 (not shown in FIG. 5) about the first axis (X axis) and about the second axis (Y axis). In this embodiment, each mover sub-assembly 570 is similar in design to the mover sub-assemblies 470A, 470B, 472A, 472B illustrated in FIG. 4I. This design has a benefit of a reduced area and can be less expensive to manufacture.

Thus, as provided herein, the three mover sub-assemblies 570 can be used to get full tip-tilt adjustment of the stage 462. However, this design may be more difficult to control as compared to the four actuator design described above.

Figure 6A:
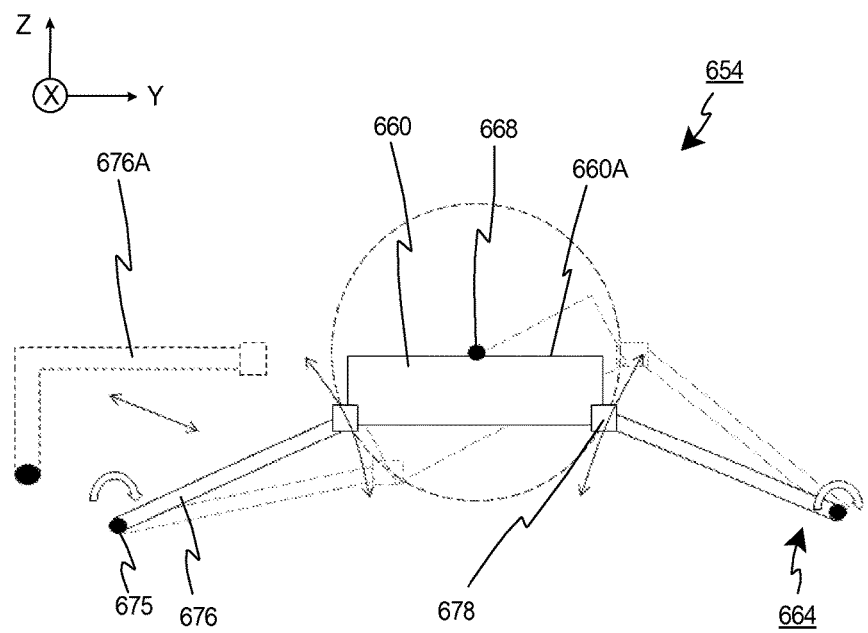
FIG. 6A is a simplified schematic that illustrates movement of an optical element having features of the present invention.

FIG. 6A is a simplified schematic that illustrates movement of an optical element 654 with the optical element 660 at a first location and at a second location illustrated in phantom. FIG. 6A also illustrates the movement point 668 (rotation point) in which the optical element 660 can be moved. In this embodiment, if the mover assembly 664 is designed to move the optical element 662 about the first axis (X axis) and about the second axis (Y axis), the optical element 662 pivots about the movement point 668 during movement about both of these axes. It should be noted that movement point 668 is in a movement plane that is defined by the X and Y axes.

As provided herein, with the present design of the mover assembly 664, the movement point 668 is near or at the reflective surface 660A of the optical element 660 (e.g. at the top of the optical element 660). In FIG. 6A, the movement point 668 is approximately at the center of the reflective surface 660A. In certain embodiments, this can be achieved by moving the location of the flexures 678 and the optical element 662 above the plane of the pivot axes 675 of the movers 474 (not shown in FIG. 6A). The mover beam 676 that accomplishes this could be straight (the simplest), L-shaped, or anything else that rigidly connects the two points. Positioning the flexures 678 above the respective pivot axis 675 is what shifts the rotation point 668. With this design, each pivot axis 675 is positioned below (along the Z axis) (i) its respective flexure 678, (ii) the movement point 668, and (iii) the movement plane. Thus, in this example, the pivot axis 675 is not in the movement plane. Alternatively, the pivot axis could be in the movement plane or above the movement plane.

As provided herein, if the out-of-plane linkages are difficult to make with MEMS manufacturing methods, the straight mover beams 676 illustrated in FIG. 6A can be replaced with an "L" shaped mover beam 676A that is illustrated in phantom to the right in FIG. 6A.

Additionally, in certain embodiments, FIG. 6A illustrates the reason for translation in the flexures 678. More specifically, as illustrated in FIG. 6A, the flexures 678 will have to "stretch" as the optical element 660 is rotated to take up the space between the dashed circle and the path the end of the beam would take if it were rotated freely about the actuation point.

Figure 6B:
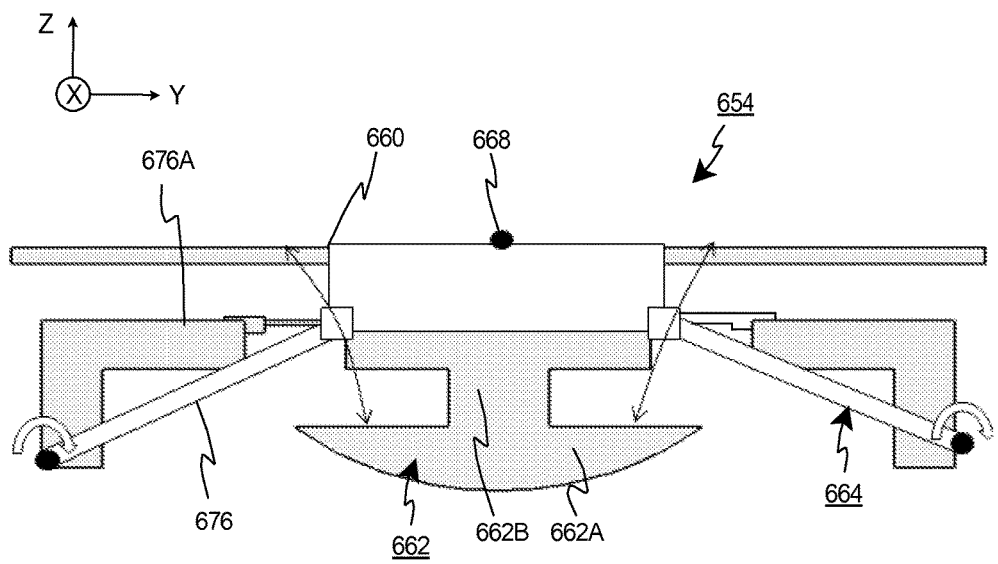
FIG. 6B is another simplified schematic that illustrates an alternative geometry of the optical element along with the design illustrated in FIG. 6A.

FIG. 6B is a more detailed schematic that illustrates another geometry of the optical element 654 along with the simplified design illustrated in FIG. 6A superimposed thereover. FIG. 6B illustrates both the "L" shaped mover beams 676A as well as the alternative, straight mover beams 676. It should be noted that movement point 668, and the stage 662 including the transfer region 662A and the connector region 662B are also illustrated in FIG. 6B.

Figure 7:
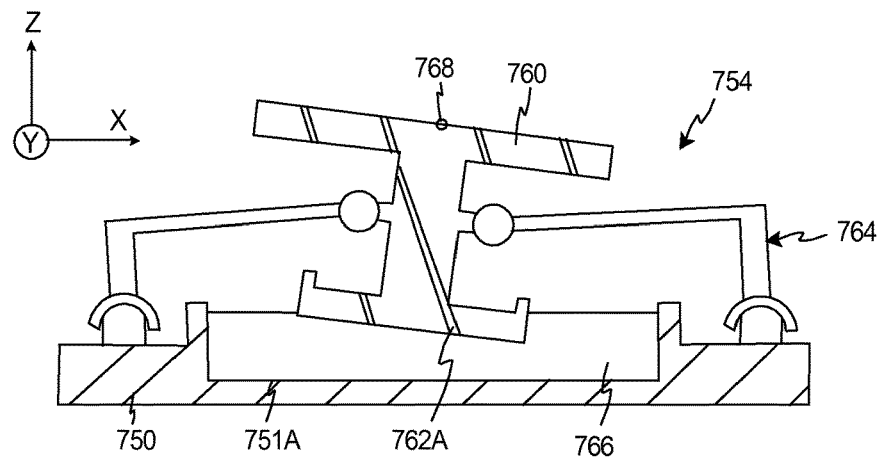
FIG. 7 is a simplified cut-away illustration of yet another embodiment of an optical element having features of the present invention.

FIG. 7 is a simplified cut-away illustration of yet another embodiment of an optical element assembly 754 that is somewhat similar to the optical elements described above. The optical element 760, the mover assembly 764, the movement point 768, and the thermally conductive medium 766 are also illustrated in FIG. 7. In this embodiment, the transfer region 762A is generally disk shaped and the element recess 751A of the base 750 defines a generally disk shaped recess. Further, the thermally conductive medium 766 fills the space between the transfer region 762A and the base 750. It should be noted that the transfer region 762A can be made relatively large to facilitate heat transfer to the thermally conductive medium 766. Further, it should be noted that the thermally conductive medium 766 does not interfere with the mover assembly 764, and in certain embodiments, does not guide the movement of the transfer region 762A.

Figure 8:
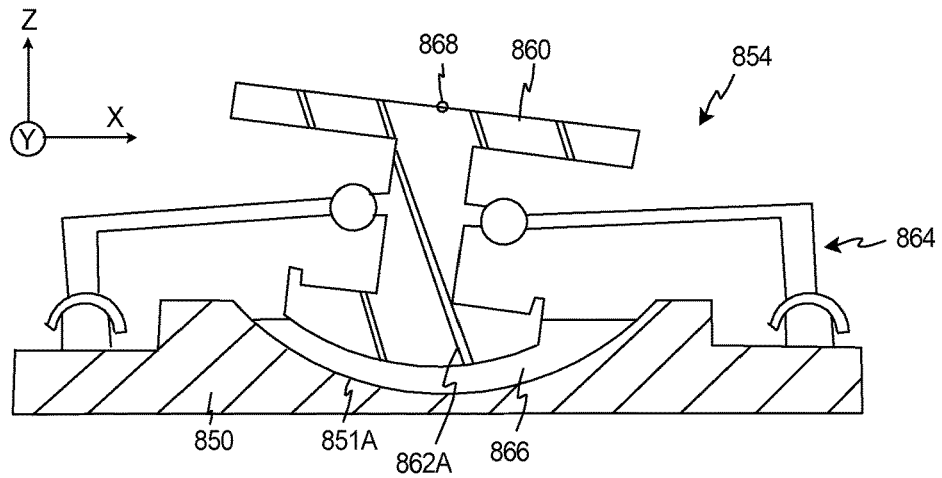
FIG. 8 is a simplified cut-away illustration of still another embodiment of an optical element having features of the present invention.

FIG. 8 is a simplified cut-away illustration of yet another embodiment of an optical element assembly 854 that is somewhat similar to the optical elements described above. The optical element 860, the mover assembly 864, the movement point 868, and the thermally conductive medium 866 are also illustrated in FIG. 8. In this embodiment, the transfer region 862A is shaped like a portion of a sphere, and the element recess 851A of the base 850 defines an aperture shaped to receive a portion of a sphere. Further, the thermally conductive medium 866 fills the space between the transfer region 862A and the base 850. It should be noted that the thermally conductive medium 866 does not interfere with the mover assembly 864, and in certain embodiments, does not guide the movement of the transfer region 862A.

Additionally, it should be noted with the design illustrated in FIG. 8, because the shape of the element recess 851A matches the partial spherical shape of the transfer region 862A, the thickness of the thermally conductive medium 866 can be maintained relatively small and substantially uniform (thinner and more uniform) during movement of the optical element 860. This will facilitate the efficient transfer of heat to the base 850.

Figure 9:
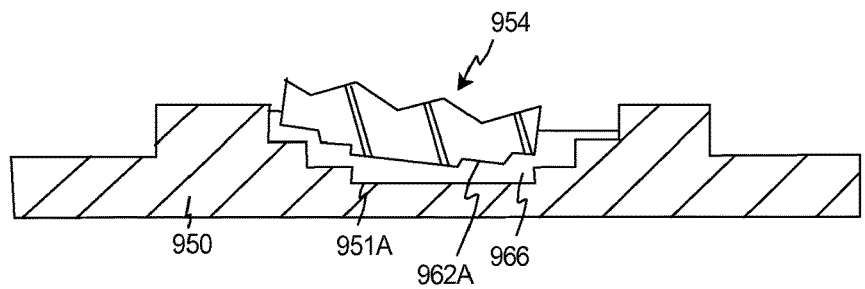
FIG. 9 is a simplified cut-away illustration of a portion of another embodiment of an optical element having features of the present invention.

FIG. 9 is a simplified cut-away illustration of a portion of another embodiment of an optical element 954. More specifically, FIG. 9 illustrates another embodiment of the transfer region 962A and the base 950. In this embodiment, because the transfer region 962A and the base 950 are spaced apart during operation, the surfaces of the transfer region 962A and the element recess 951A can be stepped for ease of manufacturing. In this embodiment, the thermally conductive medium 966 does not interfere with the mover assembly 864, and in certain embodiments, does not guide the movement of the transfer region 862A.

Figure 10A:
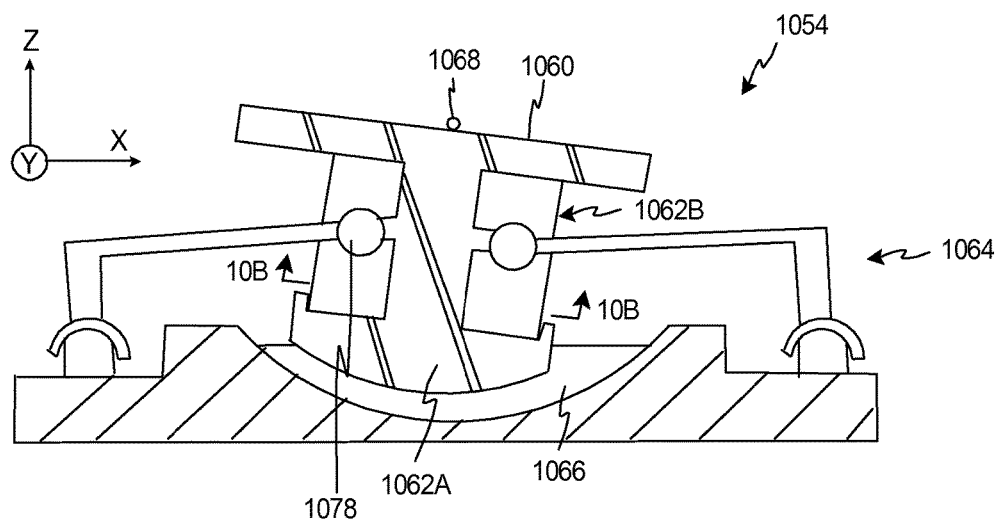
FIG. 10A is a simplified cut-away illustration of another embodiment of an optical element having features of the present invention.

FIG. 10A is a simplified cut-away illustration of another embodiment of an optical element assembly 1054 that is somewhat similar to the optical elements described above. The optical element 1060, the mover assembly 1064, the movement point 1068, and the thermally conductive medium 1066 are also illustrated in FIG. 10A. In this embodiment, the connector region 1062B of the stage 1060 is larger and generally shaped like a rectangle. The larger connector region 1062B facilitates heat transfer from the optical element 1060 to the transfer region 1062A. Similarly, in this embodiment, the thermally conductive medium 1066 fills the space between the transfer region 1062A and the base 1050.

Figure 10B:
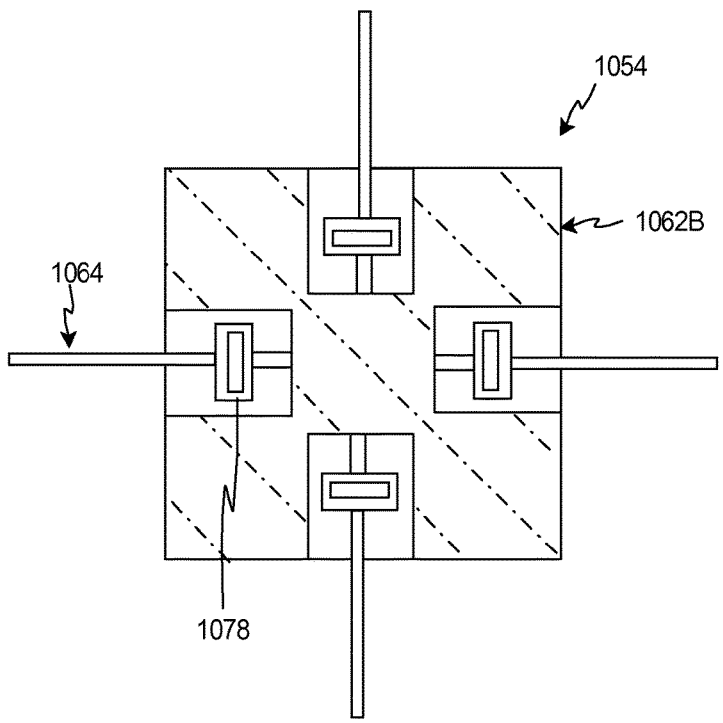
FIG. 10B is a cut-away view taken from FIG. 10A.

FIG. 10B is a cut-away view taken from FIG. 10A that illustrates the larger cross-sectioned connector region 1062B for the optical element 1054. In this embodiment, the connector region 1062B can include one or more slots that are large enough to allow room for the mover assembly 1064.

It should be noted that any method of increasing the cross-sectional area of the connector region 1062B would increase conduction from the optical element 1060 to the heat transfer region 1062. The simplest is a post (as shown earlier), but several posts or irregular shapes could be used. FIGS. 10A and 10B illustrate the situation in which the optical element 1060 and heat transfer region 1062 are connected by a solid connector region 1062B with just enough cut out to make room for the mover assembly 1064.

Additionally, the flexures 1078 are illustrated in FIGS. 10A and 10B.

Figure 11:
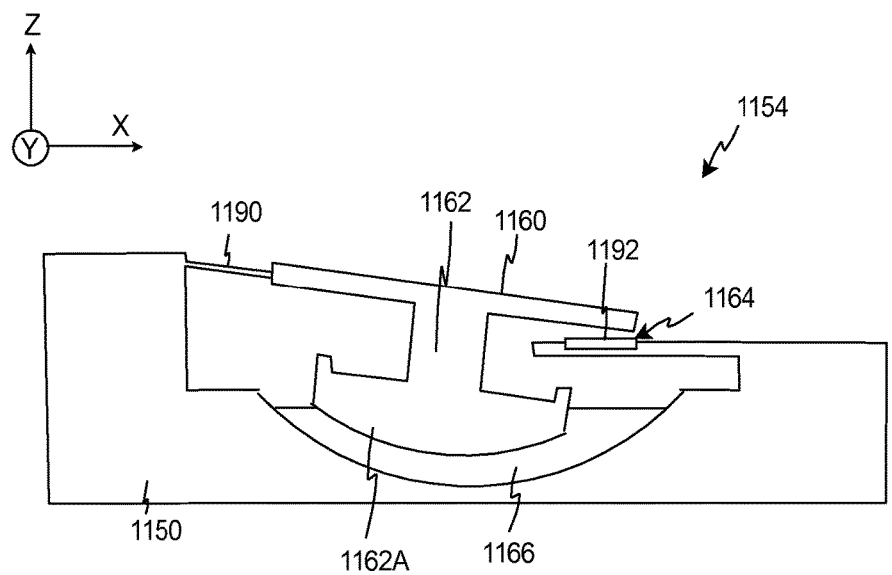
FIG. 11 is a simplified cut-away illustration of another embodiment of an optical element having features of the present invention.

FIG. 11 is a simplified cut-away illustration of another, non-exclusive embodiment of an optical element 1154 that is somewhat similar to the optical elements described above. The optical element 1160, the mover assembly 1164, the thermally conductive medium 1166, the transfer region 1162A and the base 1150 are also illustrated in FIG. 11.

In this embodiment, the mover assembly 1164 is slightly different. More specifically, in this embodiment, the mover assembly 1164 includes (i) a cantilevering flexure 1190 that flexibly secures the stage 1162 to the base 1150, and (ii) an actuator 1192 (e.g. electrostatic or magnetic) that moves the stage 1162 relative to the base 1150. Thus, as provided herein, the heat transfer mechanism including the thermally conductive medium 1166 can be used with many different types of mover assemblies 1164.

Figure 12:
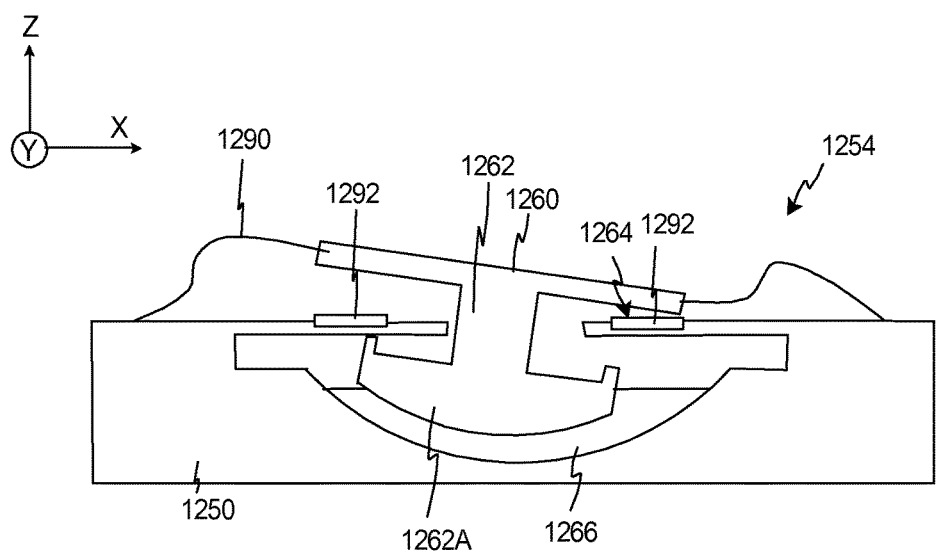
FIG. 12 is a simplified cut-away illustration of yet another embodiment of an optical element having features of the present invention.

FIG. 12 is a simplified cut-away illustration of yet another, non-exclusive embodiment of an optical element 1254 that is somewhat similar to the optical elements described above. The optical element 1260, the mover assembly 1264, the thermally conductive medium 1266, the transfer region 1262A and the base 1250 are also illustrated in FIG. 12.

In this embodiment mover assembly 1264 is again slightly different. More specifically, in this embodiment, the mover assembly 1264 includes (i) multiple (2, 3, 4, etc.) flexures 1290 that flexibly secure the stage 1262 to the base 1250, and (ii) multiple actuators 1292 (e.g. electrostatic or magnetic) (only two are shown) that move the stage 1262 relative to the base 1250.

Thus, as provided herein, the heat transfer mechanism including the thermally conductive medium 1266 and the heat transfer region 1262A can be used with many different types of mover assemblies 1264. Importantly, the heat transfer mechanism including the thermally conductive medium 1266 and the heat transfer region 1262A can be utilized with a variety of existing and different movement assemblies.

Figure 13:
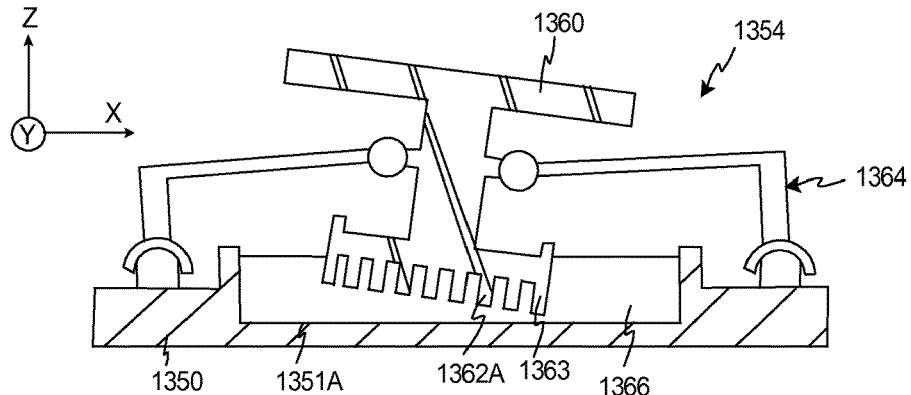
FIG. 13 is a simplified cut-away illustration of still another embodiment of an optical element.

FIG. 13 is a simplified cut-away illustration of still another embodiment of an optical element assembly 1354 that is somewhat similar to the optical element assembly described above. The optical element 1360, the mover assembly 1364, and the thermally conductive medium 1366 are also illustrated in FIG. 13. In this embodiment, the transfer region 1362A includes a plurality of spaced apart projections (e.g. fins) 1363 and the element recess 1351A of the base 1350 defines a generally rectangular shaped recess. Further, the thermally conductive medium 1366 fills the space between the transfer region 1362A and the base 1350. Alternatively, the transfer region 1362A can be generally spherical shaped with the fins, and the recess 1351A can be a spherical shaped cut-out.

Figure 14:
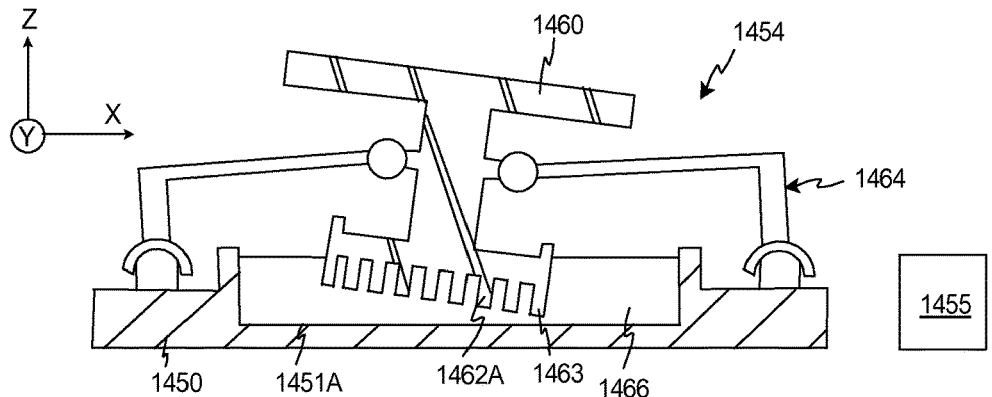
FIG. 14 is a simplified cut-away illustration of yet another embodiment of an optical element.

FIG. 14 is a simplified cut-away illustration of still another embodiment of an optical element assembly 1454 that is somewhat similar to the optical element assemblies described above with reference to FIG. 13. The optical element 1460, the mover assembly 1464, and the thermally conductive medium 1466 are also illustrated in FIG. 14. In this embodiment, the transfer region 1462A includes the plurality of fins 1463 and the element recess 1451A of the base 1450 defines the generally rectangular shaped recess. Further, the thermally conductive medium 1466 fills the space between the transfer region 1462A and the base 1450. However, in this embodiment, the assembly 1454 includes a fluid pump 1455 that circulates the thermally conductive medium 1466 in the space. With this design, the fins 1463 can be cooled via forced convection cooling with air or another fluid.

Figure 15A:
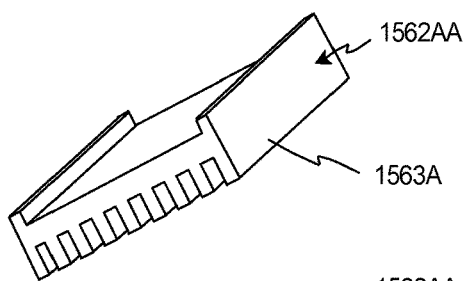
FIG. 15A is a perspective view of another embodiment of a transfer region.
Figure 15B:
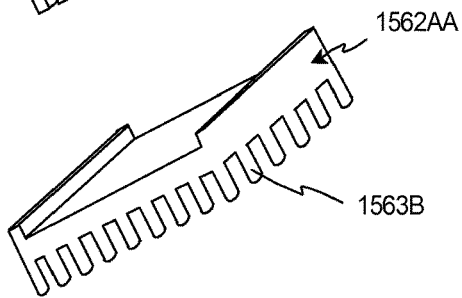
FIG. 15B is a perspective view of another embodiment of a transfer region.

FIG. 15A is a simplified perspective view of one embodiment of the transfer region 1562AA with fins 1563A that are shaped like rectangular walls. Alternatively, FIG. 15B is a simplified perspective view of another embodiment of the transfer region 1562AB with fins 1563B that are shaped like circular rods.

Figure 16A:
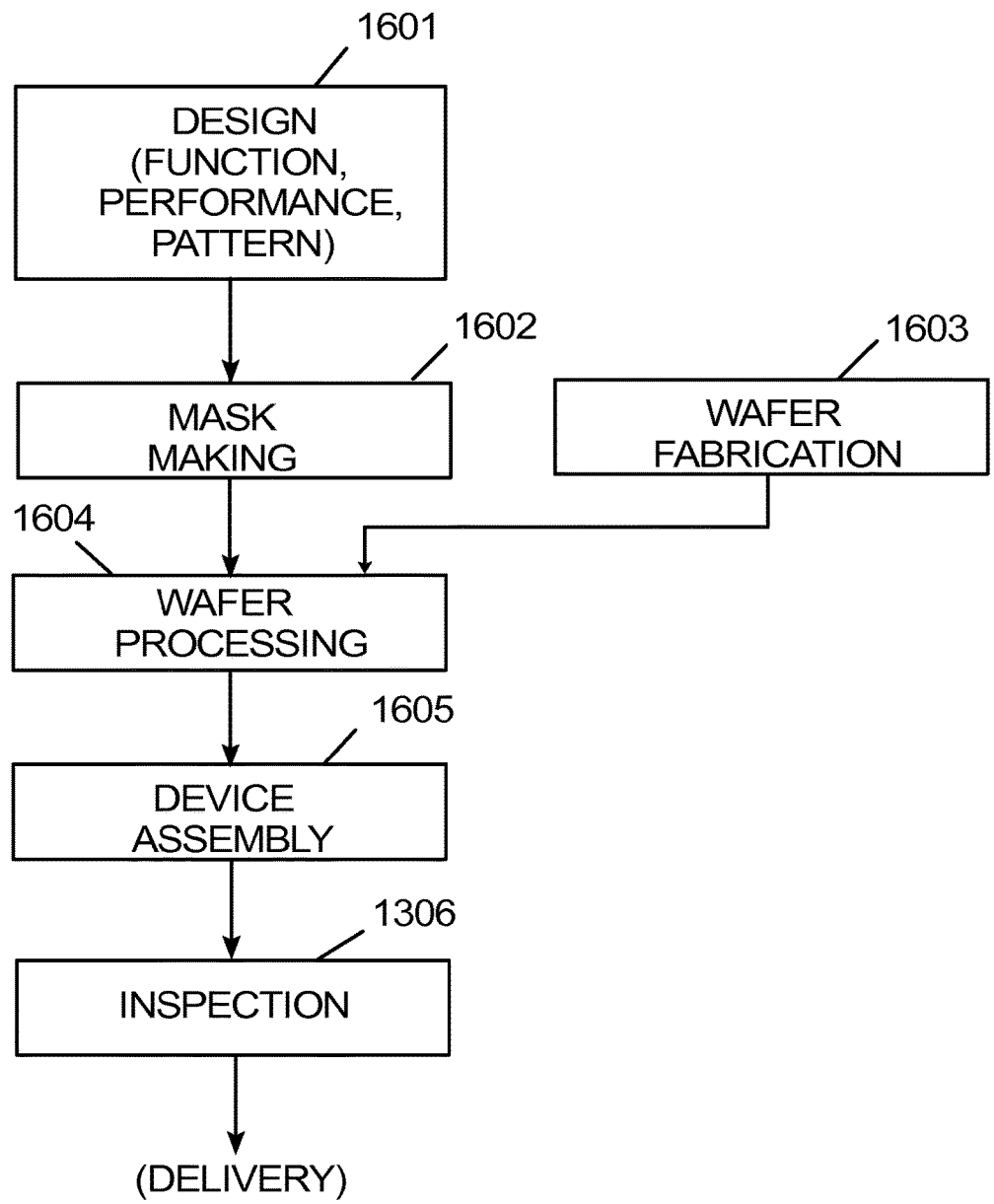
FIG. 16A is a flow chart that outlines a process for manufacturing a device in accordance with the present invention.

Semiconductor devices can be fabricated using the above described systems, by the process shown generally in FIG. 16A. In step 1601 the device's function and performance characteristics are designed. Next, in step 1602, a mask (reticle) having a pattern is designed according to the previous designing step, and in a parallel step 1603 a wafer is made from a silicon material. The mask pattern designed in step 1602 is exposed onto the wafer from step 1603 in step 1604 by a photolithography system described hereinabove in accordance with the present invention. In step 1605, the semiconductor device is assembled (including the dicing process, bonding process and packaging process), finally, the device is then inspected in step 1606.

Figure 16B:
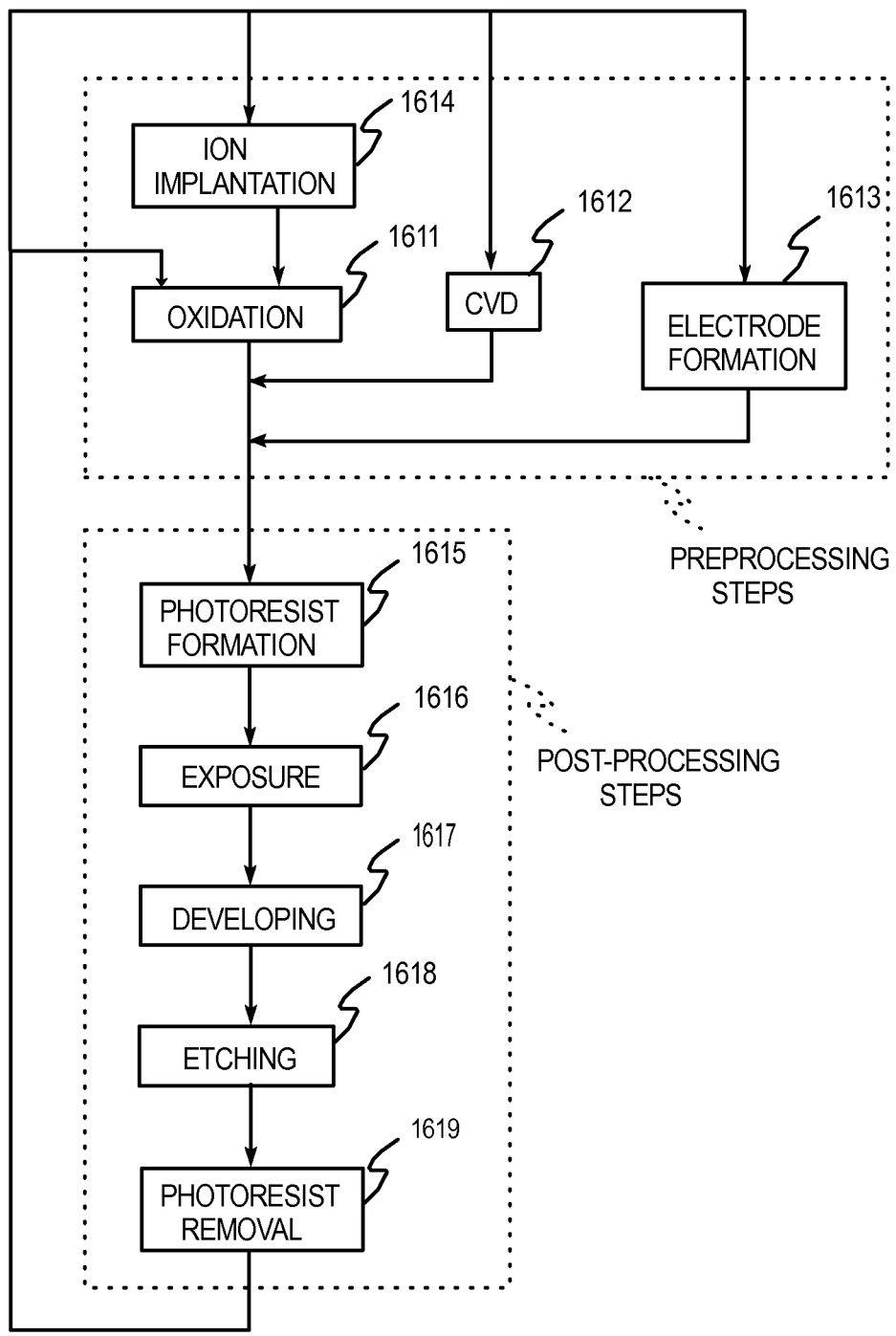
FIG. 16B is a flow chart that outlines device processing in more detail.

FIG. 16B illustrates a detailed flowchart example of the above-mentioned step 1604 in the case of fabricating semiconductor devices. In FIG. 16B, in step 1611 (oxidation step), the wafer surface is oxidized. In step 1612 (CVD step), an insulation film is formed on the wafer surface. In step 1613 (electrode formation step), electrodes are formed on the wafer by vapor deposition. In step 1614 (ion implantation step), ions are implanted in the wafer. The above mentioned steps 1611-1614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1615 (photoresist formation step), photoresist is applied to a wafer. Next, in step 1616 (exposure step), the above-mentioned exposure device is used to transfer the circuit pattern of a mask (reticle) to a wafer. Then in step 1617 (developing step), the exposed wafer is developed, and in step 1618 (etching step), parts other than residual photoresist (exposed material surface) are removed by etching. In step 1619 (photoresist removal step), unnecessary photoresist remaining after etching is removed. Multiple circuit patterns are formed by repetition of these preprocessing and post-processing steps.

While the method and system as shown and disclosed herein is fully capable of obtaining the objects and providing the advantages herein before stated, it is to be understood that it is merely illustrative of the presently preferred embodiments of the invention and that no limitations are intended to the details of construction or design herein shown.

What is claimed is:

1. An optical element assembly for directing a beam, the optical element assembly comprising:
a base including a plurality of recesses; and
a plurality of elements, each of the plurality of elements including (i) an optical element, (ii) a stage that retains the optical element, the stage including a transfer region that is sized and shaped to fit within one of the plurality of recesses with a gap therebetween, and a connector region that is connected to and extends between the optical element and the transfer region such that the transfer region is rigidly connected to the optical element, (iii) a mover assembly that is coupled to the optical element, the mover assembly moving the optical element and the stage about a first axis and about a second axis that is orthogonal to the first axis relative to the base while maintaining the transfer region spaced apart the gap from the base, the mover assembly being secured in direct contact with the connector region between the optical element and the transfer region, and (iv) a thermally conductive medium positioned within the gap between the transfer region and the base to transfer heat from the transfer region to the base so that heat transferred with the thermally conductive medium does not cause thermal distortion of the mover assembly;
wherein the optical elements are arranged in a patterned array such that the optical elements are adjacent to one another and are positioned in approximately the same plane.

2. The optical element assembly of claim 1 wherein the patterned array of optical elements is substantially circle-shaped.

3. The optical element assembly of claim 1 wherein each optical element includes at least one of (i) a mirror; (ii) a reflective surface; or (iii) a lens.

4. The optical element assembly of claim 1 wherein for at least one of the plurality of elements the mover assembly includes (i) a first axis movement assembly that moves the optical element about the first axis, the first axis movement assembly including a first flexure so that movement of the optical element about the first axis with the first axis movement assembly is decoupled from the movement of the optical element about the second axis; and (ii) a second axis movement assembly that moves the optical element about the second axis, the second axis movement assembly including a second flexure so that movement of the optical element about the second axis with the second axis movement assembly is decoupled from the movement of the optical element about the first axis.

5. The optical element assembly of claim 1 wherein for each of the plurality of elements the mover assembly includes (i) a first axis movement assembly that moves the optical element about the first axis, the first axis movement assembly including a first flexure so that movement of the optical element about the first axis with the first axis movement assembly is decoupled from the movement of the optical element about the second axis; and (ii) a second axis movement assembly that moves the optical element about the second axis, the second axis movement assembly including a second flexure so that movement of the optical element about the second axis with the second axis movement assembly is decoupled from the movement of the optical element about the first axis.

6. The optical element assembly of claim 5 wherein the mover assembly moves the optical element to move approximately about a movement point that is near a center of a reflective surface of the optical element.

7. An optical element assembly for directing a beam, the optical element assembly comprising:
a base including a plurality of recesses; and
a plurality of elements, each of the plurality of elements including (i) an optical element, (ii) a stage that retains the optical element, the stage including a transfer region that is sized and shaped to fit within one of the plurality of recesses with a gap therebetween, and a connector region that is connected to and extends between the optical element and the transfer region such that the transfer region is rigidly connected to the optical element, (iii) a mover assembly that is coupled to the optical element, the mover assembly moving the optical element and the stage about a first axis and about a second axis that is orthogonal to the first axis relative to the base while maintaining the transfer region spaced apart the gap from the base, the mover assembly being secured to the connector region between the optical element and the transfer region, the mover assembly moving the optical element to move approximately about a movement point that is near a center of a reflective surface of the optical element, and (iv) a thermally conductive medium positioned within the gap between the transfer region and the base to transfer heat from the transfer region to the base so that heat transferred with the thermally conductive medium does not cause thermal distortion of the mover assembly;
wherein the optical elements are arranged in a patterned array such that the optical elements are adjacent to one another and are positioned in approximately the same plane;
wherein for each of the plurality of elements the mover assembly includes (i) a first axis movement assembly that moves the optical element about the first axis, the first axis movement assembly including a first flexure so that movement of the optical element about the first axis with the first axis movement assembly is decoupled from the movement of the optical element about the second axis; and (ii) a second axis movement assembly that moves the optical element about the second axis, the second axis movement assembly including a second flexure so that movement of the optical element about the second axis with the second axis movement assembly is decoupled from the movement of the optical element about the first axis; and
wherein the mover assembly includes a linkage that is coupled to the optical element, and a mover that pivots the linkage about a pivot axis; wherein the movement point is in a movement plane defined by the first axis and the second axis, and wherein the pivot axis is not in the movement plane.

8. The optical element assembly of claim 1 wherein for at least one of the plurality of elements the mover assembly includes (i) a first axis movement assembly that moves the optical element about the first axis, the first axis movement assembly including a first mover and a first flexure that flexibly couples the first mover to the optical element so that movement by the first mover causes movement of the optical element about the first axis without movement of the optical element about the second axis; and (ii) a second axis movement assembly that moves the optical element about the second axis, the second axis movement assembly including a second mover and a second flexure that flexibly couples the second mover to the optical element so that movement by the second mover causes movement of the optical element about the second axis without movement of the optical element about the first axis.

9. The optical element assembly of claim 1 wherein for each of the plurality of elements the mover assembly includes (i) a first axis movement assembly that moves the optical element about the first axis, the first axis movement assembly including a first mover and a first flexure that flexibly couples the first mover to the optical element so that movement by the first mover causes movement of the optical element about the first axis without movement of the optical element about the second axis; and (ii) a second axis movement assembly that moves the optical element about the second axis, the second axis movement assembly including a second mover and a second flexure that flexibly couples the second mover to the optical element so that movement by the second mover causes movement of the optical element about the second axis without movement of the optical element about the first axis.

10. The optical element assembly of claim 1 wherein the base includes at least one fluid passageway for directing a circulation fluid through the base.

11. The optical element assembly of claim 1 further comprising a fluid system that circulates the thermally conductive medium for each of the plurality of elements within the gap between the transfer region and the base, and wherein the thermally conductive medium has a thermal conductivity that is greater than the thermal conductivity of air.

12. The optical element assembly of claim 1 wherein for each of the plurality of elements the thermally conductive medium is selected from the group that includes an ionic fluid and a liquid metal.

13. The optical element assembly of claim 1 wherein for at least one of the plurality of elements the transfer region includes a surface that is shaped somewhat similar to a truncated sphere; and wherein each of the plurality of recesses defines an indentation that is shaped somewhat similar to a truncated sphere.

14. The optical element assembly of claim 1 wherein for each of the plurality of elements the transfer region includes a surface that is shaped somewhat similar to a truncated sphere; and wherein each of the plurality of recesses defines an indentation that is shaped somewhat similar to a truncated sphere.

15. An exposure apparatus for transferring an image to a wafer, the exposure apparatus comprising: a wafer stage that retains and positions the wafer; an illumination source that generates a beam; and the optical element assembly of claim 1 that directs the beam.

16. A method for directing a beam, the method comprising the steps of:
providing a base including a plurality of recesses;
positioning a plurality of optical elements in a path of the beam, the plurality of optical elements being arranged in a patterned array such that the plurality of optical elements are adjacent to one another and are positioned in approximately the same plane;
retaining each of the plurality of optical elements with a corresponding stage, the stage including a transfer region that is positioned within one of the plurality of recesses with a gap therebetween, and a connector region that is connected to and extends between the optical element and the transfer region such that the transfer region is rigidly connected to the optical element;
moving each of the plurality of optical elements with a corresponding mover assembly about a first axis and about a second axis that is orthogonal to the first axis relative to the base while maintaining the gap between the base and the corresponding transfer region, wherein, the corresponding mover assembly is coupled in direct contact with the corresponding connector region between the optical element and the transfer region;
transferring heat away from each of the plurality of optical elements with the corresponding transfer region; and
transferring heat away from the transfer region for each stage with a thermally conductive medium positioned within the gap between the transfer region and the base so that heat transferred with the thermally conductive medium does not cause thermal distortion of the mover assembly.

17. The method of claim 16 wherein the step of moving each of the plurality of optical elements includes the steps of (i) moving each optical element about the first axis with a first axis movement assembly, the first axis movement assembly including a first flexure so that movement of the optical element about the first axis is decoupled from the movement of the optical element about the second axis; and (ii) moving each optical element about the second axis with a second axis movement assembly, the second axis movement assembly including a second flexure so that movement of the optical element about the second axis is decoupled from the movement of the optical element about the first axis.

18. The method of claim 16 wherein the step of moving each of the plurality of optical elements includes the steps of (i) moving each optical element about the first axis with a first axis movement assembly, the first axis movement assembly including a first mover and a first flexure that flexibly couples the first mover to the optical element so that movement by the first mover causes movement of the optical element about the first axis without movement of the optical element about the second axis; and (ii) moving each optical element about the second axis with a second axis movement assembly, the second axis movement assembly including a second mover and a second flexure that flexibly couples the second mover to the optical element so that movement by the second mover causes movement of the optical element about the second axis without movement of the optical element about the first axis.

19. The method of claim 16 further comprising the step of circulating the thermally conductive medium for each of the plurality of optical elements within the gap between the transfer region and the base with a fluid system, and wherein the thermally conductive medium has a thermal conductivity that is greater than the thermal conductivity of air.

20. The method of claim 16 wherein the step of retaining each of the plurality of optical elements includes the transfer region of each stage including a surface that is shaped somewhat similar to a truncated sphere; and wherein the step of providing a base includes each of the plurality of recesses defining an indentation that is shaped somewhat similar to a truncated sphere.

21. An optical element assembly for directing a beam, the optical element assembly comprising:
- a base including a plurality of recesses; and
- a plurality of elements, each of the plurality of elements including (i) an optical element including a reflective surface, (ii) a stage that retains the optical element, the stage including a transfer region that is sized and shaped to fit within one of the plurality of recesses with a gap therebetween, and a connector region that is connected to and extends between the optical element and the transfer region such that the transfer region is rigidly connected to the optical element, (iii) a mover assembly including a linkage that is coupled to the optical element, and a mover that pivots the linkage about a pivot axis, the mover assembly moving the optical element and the stage about a first axis and about a second axis that is orthogonal to the first axis relative to the base while maintaining the gap, and (iv) a thermally conductive medium positioned within the gap between the transfer region and the base to transfer heat from the transfer region to the base so that heat transferred with the thermally conductive medium does not cause thermal distortion of the mover assembly;
- wherein the optical elements are arranged in a patterned array such that the optical elements are adjacent to one another and are positioned in approximately the same plane; and
- wherein the mover assembly moves the optical element about a movement point on the reflective surface that is in a movement plane defined by the first axis and the second axis, and wherein the pivot axis is not in the movement plane.

* * * * *